United States Patent
Tanaka et al.

(10) Patent No.: US 11,114,650 B2
(45) Date of Patent: *Sep. 7, 2021

(54) METHOD AND APPARATUS FOR PRODUCING FLEXIBLE OLED DEVICE INCLUDING LIFT-OFF LIGHT IRRADIATION

(71) Applicant: Sakai Display Products Corporation, Sakai (JP)

(72) Inventors: Kohichi Tanaka, Sakai (JP); Katsuhiko Kishimoto, Sakai (JP)

(73) Assignee: Sakai Display Products Corporation, Osaka (JP)

( * ) Notice: Subject to any disclaimer, the term of this patent is extended or adjusted under 35 U.S.C. 154(b) by 283 days.

This patent is subject to a terminal disclaimer.

(21) Appl. No.: 16/312,419

(22) PCT Filed: Oct. 26, 2017

(86) PCT No.: PCT/JP2017/038783
§ 371 (c)(1),
(2) Date: Dec. 21, 2018

(87) PCT Pub. No.: WO2019/082355
PCT Pub. Date: May 2, 2019

(65) Prior Publication Data
US 2020/0381672 A1  Dec. 3, 2020

(51) Int. Cl.
*H01L 51/56* (2006.01)
*H01L 51/00* (2006.01)
*H01L 51/52* (2006.01)

(52) U.S. Cl.
CPC .......... *H01L 51/56* (2013.01); *H01L 51/0097* (2013.01); *H01L 51/524* (2013.01); *H01L 51/5253* (2013.01)

(58) Field of Classification Search
CPC .............. H01L 51/0097; H01L 51/524; H01L 51/5253; H01L 51/56
See application file for complete search history.

(56) References Cited

U.S. PATENT DOCUMENTS 10,505,155 B1 * 12/2019 Kishimoto ............... G09F 9/30
2013/0228754 A1    9/2013 Park
(Continued)

FOREIGN PATENT DOCUMENTS

JP    2002-361797 A    12/2002
JP    5225024 B2       7/2013
(Continued)

OTHER PUBLICATIONS

Decision to Grant for related Japanese Application No. 2018-511777 dated Aug. 21, 2018.
(Continued)

*Primary Examiner* — Thao X Le
*Assistant Examiner* — Gardner W. S. Swan
(74) *Attorney, Agent, or Firm* — Renner, Otto, Boisselle & Sklar, LLP

(57) ABSTRACT

According to a flexible OLED device production method of the present disclosure, after an intermediate region (30*i*) and flexible substrate regions (30*d*) of a plastic film (30) of a multilayer stack (100) are divided from one another, the interface between the flexible substrate regions (30*d*) and a glass base (10) is irradiated with laser light. The multilayer stack (100) is separated into a first portion (110) and a second portion (120) while the multilayer stack (100) is in contact with a stage (212). The first portion (110) includes a plurality of OLED devices (1000) which are in contact with the stage (212). The OLED devices (1000) include a plurality of functional layer regions (20) and the flexible
(Continued)

substrate regions (30*d*). The second portion (120) includes the glass base (10) and the intermediate region (30*i*).

9 Claims, 19 Drawing Sheets

(56) References Cited

U.S. PATENT DOCUMENTS

| | | | |
|---|---|---|---|
| 2014/0332150 A1* | 11/2014 | Hirakata | B32B 38/10 |
| | | | 156/247 |
| 2015/0059987 A1 | 3/2015 | Kumakura et al. | |
| 2015/0280127 A1 | 10/2015 | Suzuki et al. | |
| 2015/0375494 A1* | 12/2015 | Xie | B32B 43/006 |
| | | | 156/379.6 |
| 2019/0067605 A1 | 2/2019 | Tanaka et al. | |
| 2020/0168820 A1* | 5/2020 | Tanaka | H01L 27/3244 |
| 2020/0287356 A1* | 9/2020 | Kishimoto | H01S 5/4043 |

FOREIGN PATENT DOCUMENTS

| | | |
|---|---|---|
| JP | 2014-048619 A | 3/2014 |
| JP | 2015-017008 A | 1/2015 |
| JP | 2015-173088 A | 10/2015 |
| JP | 2015-195106 A | 11/2015 |
| JP | 2017-063064 A | 3/2017 |
| WO | WO 2015/190418 A1 | 12/2015 |
| WO | WO 2017/154235 A1 | 9/2017 |

OTHER PUBLICATIONS

Office Action for related Japanese Application No. 2018-511777 dated May 14, 2018 and English translation.
PCT International Search Report for related International Application No. PCT/JP2017/038783 dated Jan. 30, 2018.

* cited by examiner

METHOD AND APPARATUS FOR PRODUCING FLEXIBLE OLED DEVICE INCLUDING LIFT-OFF LIGHT IRRADIATION

TECHNICAL FIELD

The present disclosure relates to a method and apparatus for producing a flexible OLED device.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the above-described flexible display is carried out using a glass base on which a plastic film is formed over the upper surface. The glass base functions as a support (carrier) for keeping the shape of the plastic film flat during the production process. Elements such as TFTs and OLEDs, a gas barrier film, and the other constituents are formed on the plastic film, whereby the structure of a flexible OLED device is realized while it is supported by the glass base. Thereafter, the flexible OLED device is delaminated from the glass base and gains flexibility. The entirety of a portion in which elements such as TFTs and OLEDs are arrayed can be referred to as "functional layer region".

According to the prior art, a sheet-like structure including a plurality of flexible OLED devices is delaminated from a glass base, and thereafter, optical parts and other constituents are mounted to this sheet-like structure. Thereafter, the sheet-like structure is divided into a plurality of flexible devices. This dividing is realized by, for example, laser beam irradiation.

Patent Document No. 1 discloses the method of irradiating the interface between each flexible OLED device and the glass base with laser light (lift-off light) in order to strip each flexible OLED device from the glass base (supporting substrate). According to the method disclosed in Patent Document No. 1, after irradiation with the lift-off light, respective flexible OLED devices are divided from one another, and each of the flexible OLED devices is delaminated from the glass base.

CITATION LIST

Patent Literature

Patent Document No. 1: Japanese Laid-Open Patent Publication No. 2014-48619

SUMMARY OF INVENTION

Technical Problem

According to the conventional production method, the dividing by means of laser beam irradiation is carried out after expensive parts, for example, encapsulation film, polarizer, and/or heat radiation sheet, are mounted to a sheet-like structure including a plurality of flexible OLED devices. Therefore, unnecessary parts divided by laser beam irradiation, i.e., parts which are not to be constituents of a final OLED device, are quite useless. Also, there is a problem that, after being delaminated from the glass base, it is difficult to handle a plurality of flexible OLED devices which have no rigidity.

The present disclosure provides a method and apparatus for producing a flexible OLED device which are capable of solving the above-described problems.

Solution to Problem

A flexible OLED device production method of the present disclosure includes, in an exemplary embodiment, providing a multilayer stack which has a first surface and a second surface, the multilayer stack including a glass base which defines the first surface, a plurality of functional layer regions each including a TFT layer and an OLED layer, a synthetic resin film provided between the glass base and the plurality of functional layer regions and bound to the glass base, the synthetic resin film including a plurality of flexible substrate regions respectively supporting the plurality of functional layer regions and an intermediate region surrounding the plurality of flexible substrate regions, and a protection sheet which covers the plurality of functional layer regions and which defines the second surface; dividing the intermediate region and respective ones of the plurality of flexible substrate regions of the synthetic resin film from one another; irradiating an interface between the plurality of flexible substrate regions of the synthetic resin film and the glass base with laser light; and separating the multilayer stack into a first portion and a second portion by increasing a distance from a stage to the glass base while the second surface of the multilayer stack is kept in contact with the stage. The first portion of the multilayer stack includes a plurality of OLED devices which are in contact with the stage, and the plurality of OLED devices respectively include the plurality of functional layer regions and include the plurality of flexible substrate regions of the synthetic resin film, and the second portion of the multilayer stack includes the glass base and the intermediate region of the synthetic resin film.

In one embodiment, separating the multilayer stack into the first portion and the second portion is carried out while the stage holds the second surface of the multilayer stack.

In one embodiment, irradiating the interface between the plurality of flexible substrate regions of the synthetic resin film and the glass base with the laser light is carried out while the stage holds the second surface of the multilayer stack.

In one embodiment, a surface of the stage includes a first region which is to face the plurality of OLED devices and a second region which is to face the intermediate region of the synthetic resin film, and suction in the first region is greater than suction in the second region.

In one embodiment, the method further includes, before bringing the second surface of the multilayer stack into contact with the stage, placing a suction sheet on the stage, the suction sheet having a plurality of openings, wherein the stage includes a porous plate on which the suction sheet is to be placed, and the suction sheet includes a first region which is to be in contact with the plurality of OLED devices and a second region which is to face the intermediate region of the synthetic resin film, an aperture ratio of the first region being higher than an aperture ratio of the second region.

In one embodiment, the method further includes, after separating the multilayer stack into the first portion and the second portion, sequentially or concurrently performing a process on the plurality of OLED devices which are in contact with the stage.

In one embodiment, the method further includes, after separating the multilayer stack into the first portion and the second portion, adhering another protection sheet to the plurality of OLED devices which are in contact with the stage.

In one embodiment, the method further includes detaching from the stage the plurality of OLED devices which are bound to the another protection sheet.

In one embodiment, the method further includes sequentially or concurrently performing a process on the plurality of OLED devices which are bound to the another protection sheet.

In one embodiment, the process includes attaching a dielectric and/or electrically-conductive film to each of the plurality of OLED devices.

In one embodiment, the process includes cleaning or etching each of the plurality of OLED devices.

In one embodiment, the process includes mounting an optical part and/or an electronic part to each of the plurality of OLED devices.

In one embodiment, the process includes cleaning or etching each of the plurality of OLED devices.

A flexible OLED device production apparatus of the present disclosure includes, in an exemplary embodiment, a stage for supporting a multilayer stack which has a first surface and a second surface, the multilayer stack including a glass base which defines the first surface, a plurality of functional layer regions each including a TFT layer and an OLED layer, a synthetic resin film provided between the glass base and the plurality of functional layer regions and bound to the glass base, the synthetic resin film including a plurality of flexible substrate regions respectively supporting the plurality of functional layer regions and an intermediate region surrounding the plurality of flexible substrate regions, and a protection sheet which covers the plurality of functional layer regions and which defines the second surface, the intermediate region and respective ones of the plurality of flexible substrate regions of the synthetic resin film being divided from one another; a lift-off light irradiation unit for irradiating with laser light an interface between the plurality of flexible substrate regions of the synthetic resin film and the glass base in the multilayer stack supported by the stage; and an actuator for increasing a distance from the stage to the glass base while the stage holds the second surface of the multilayer stack by suction, thereby separating the multilayer stack into a first portion and a second portion. The first portion of the multilayer stack includes a plurality of OLED devices adhered by suction to the stage, and the plurality of OLED devices respectively include the plurality of functional layer regions and include the plurality of flexible substrate regions of the synthetic resin film, and the second portion of the multilayer stack includes the glass base and the intermediate region of the synthetic resin film.

In one embodiment, the surface of the stage includes a first region which is to face the plurality of OLED devices and a second region which is to face the intermediate region of the synthetic resin film, and suction in the first region is greater than suction in the second region.

In one embodiment, the stage includes a porous plate, and a suction sheet placed on the porous plate, the suction sheet having a plurality of openings, and the suction sheet includes a first region which is to be in contact with the plurality of OLED devices and a second region which is to face the intermediate region of the synthetic resin film, an aperture ratio of the first region being higher than an aperture ratio of the second region.

A suction sheet of the present disclosure is, in an exemplary embodiment, a suction sheet for use in the above-described production apparatus, the suction sheet including: a first region which is to be in contact with the plurality of OLED devices; and a second region which is to face the intermediate region of the synthetic resin film, wherein an aperture ratio of the first region is higher than an aperture ratio of the second region.

Advantageous Effects of Invention

According to an embodiment of the present invention, a novel method for producing a flexible OLED device which is capable of solving the above-described problems is provided.

DESCRIPTION OF EMBODIMENTS

An embodiment of a method and apparatus for producing a flexible OLED device of the present disclosure is described with reference to the drawings. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventors provide the attached drawings and the following description for the purpose of assisting those skilled in the art to fully understand the present disclosure. Providing these drawings and description does not intend to limit the subject matter recited in the claims.

<Multilayer Stack>

Figure 1A:
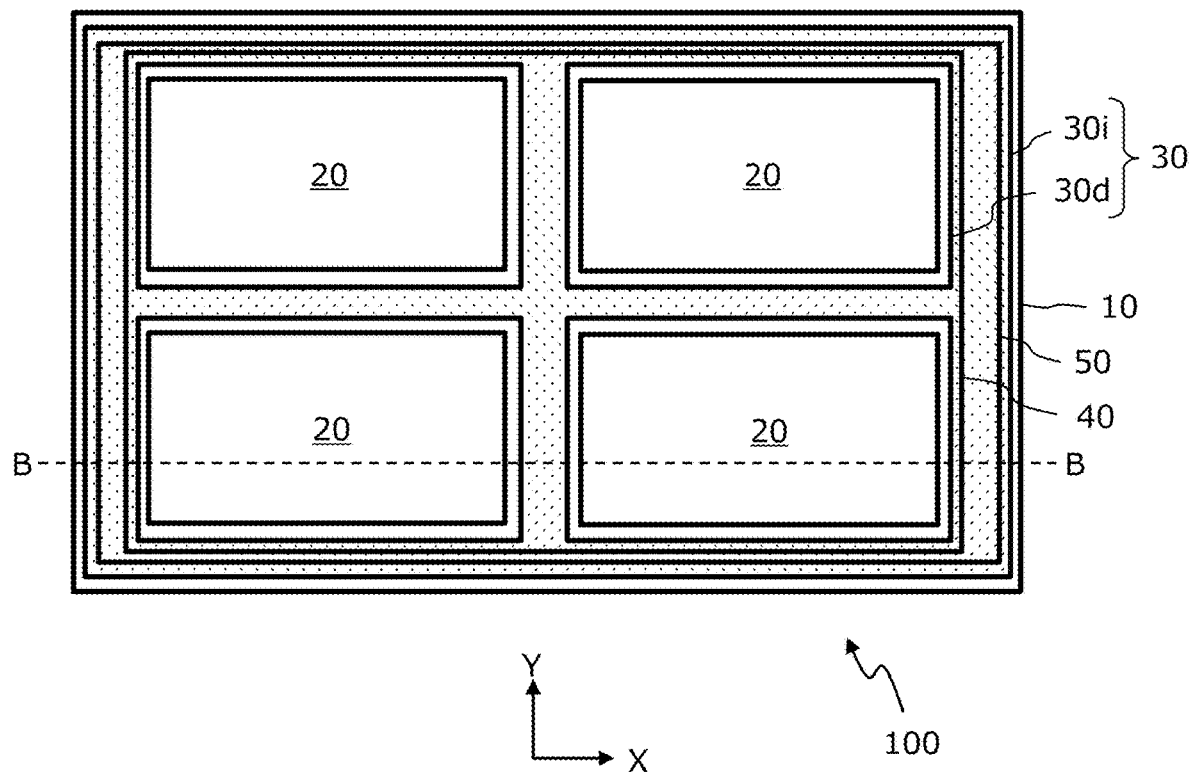
FIG. 1A is a plan view showing a configuration example of a multilayer stack used in a flexible OLED device production method of the present disclosure.
Figure 1B:
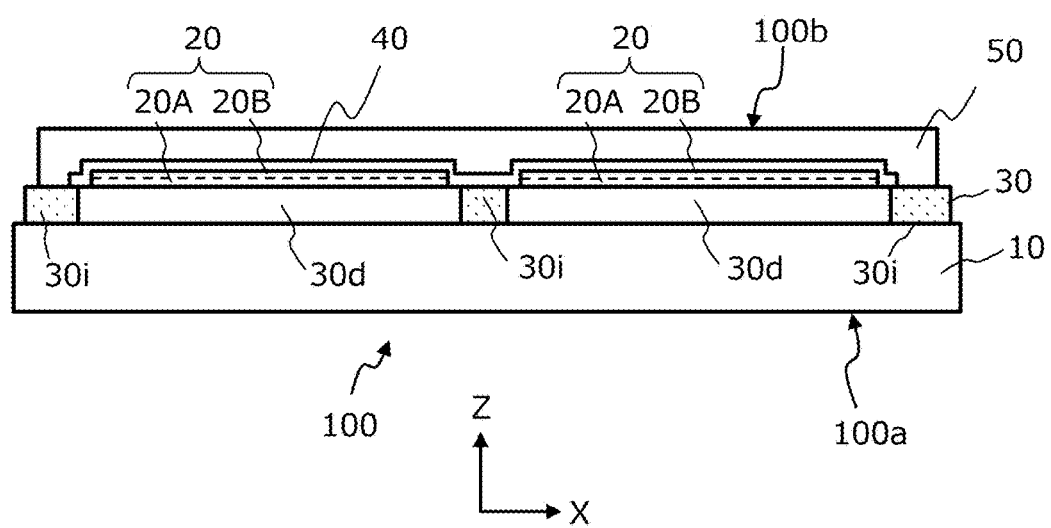
FIG. 1B is a cross-sectional view of the multilayer stack taken along line B-B of FIG. 1A.

See FIG. 1A and FIG. 1B. In a flexible OLED device production method of the present embodiment, firstly, a multilayer stack 100 illustrated in FIG. 1A and FIG. 1B is provided. FIG. 1A is a plan view of the multilayer stack 100.

FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 includes a glass base (motherboard or carrier) 10, a plurality of functional layer regions 20 each including a TFT layer 20A and an OLED layer 20B, a synthetic resin film (hereinafter, simply referred to as "plastic film") 30 provided between the glass base 10 and the plurality of functional layer regions 20 and bound to the glass base 10, and a protection sheet 50 covering the plurality of functional layer regions 20. The multilayer stack 100 further includes a gas barrier film 40 provided between the plurality of functional layer regions 20 and the protection sheet 50 so as to cover the entirety of the functional layer regions 20. The multilayer stack 100 may include another unshown layer, such as a buffer layer.

The first surface 100a of the multilayer stack 100 is defined by the glass base 10. The second surface 100b of the multilayer stack 100 is defined by the protection sheet 50. The glass base 10 and the protection sheet 50 are materials temporarily used in the production process but are not constituents of a final flexible OLED device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, parts of the plastic film 30 lying immediately under respective ones of the functional layer regions 20 are the flexible substrate regions 30d, and the other part of the plastic film 30 is the intermediate region 30i.

Each of the plurality of functional layer regions 20 is a constituent of a final flexible OLED device. In other words, the multilayer stack 100 has such a structure that a plurality of flexible OLED devices which are not yet divided from one another are supported by a single glass base 10. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns according to the arrangement of the flexible OLED devices. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible OLED device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 supported by a single glass base 10 is arbitrary.

The size or proportion of each component illustrated in respective drawings is determined from the viewpoint of understandability. The actual size or proportion is not necessarily reflected in the drawings.

Figure 1C:
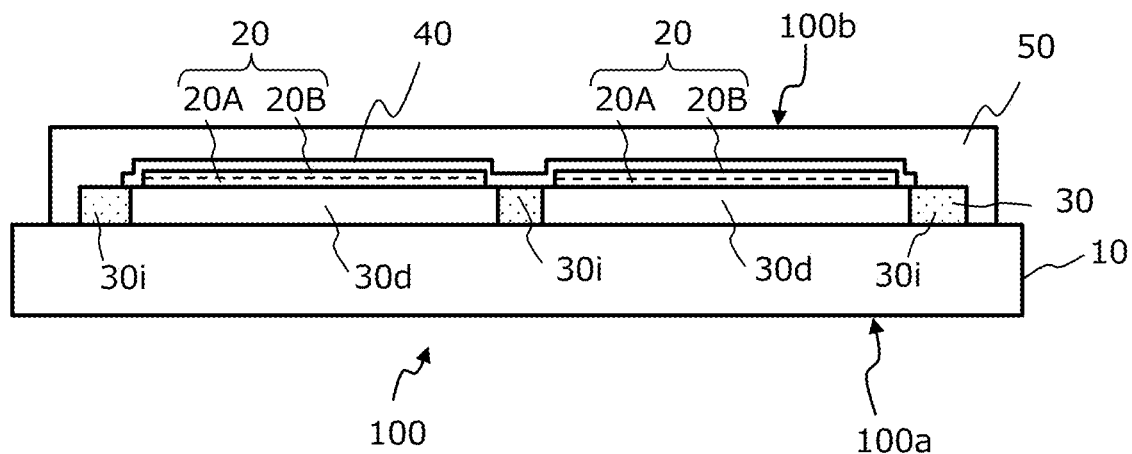
FIG. 1C is a cross-sectional view showing another example of the multilayer stack.
Figure 1D:
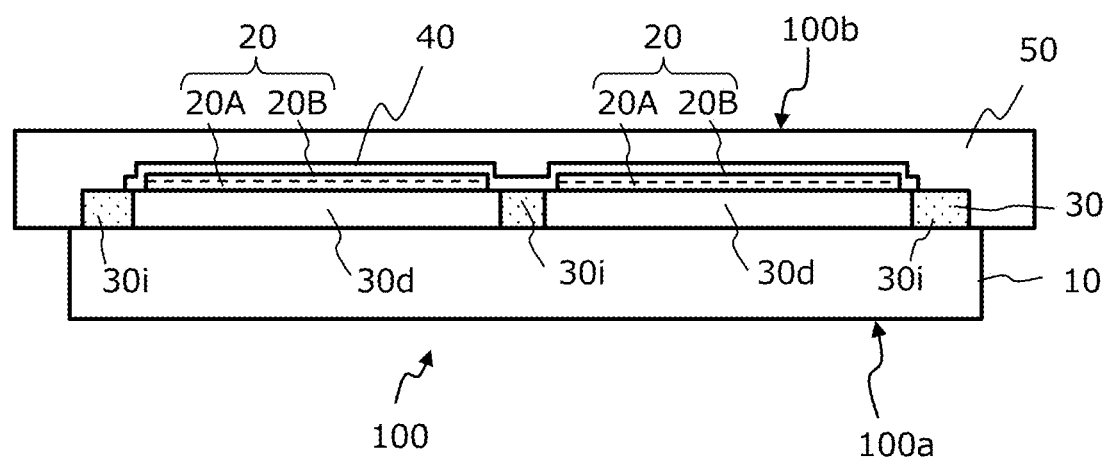
FIG. 1D is a cross-sectional view showing still another example of the multilayer stack.
Figure 13:
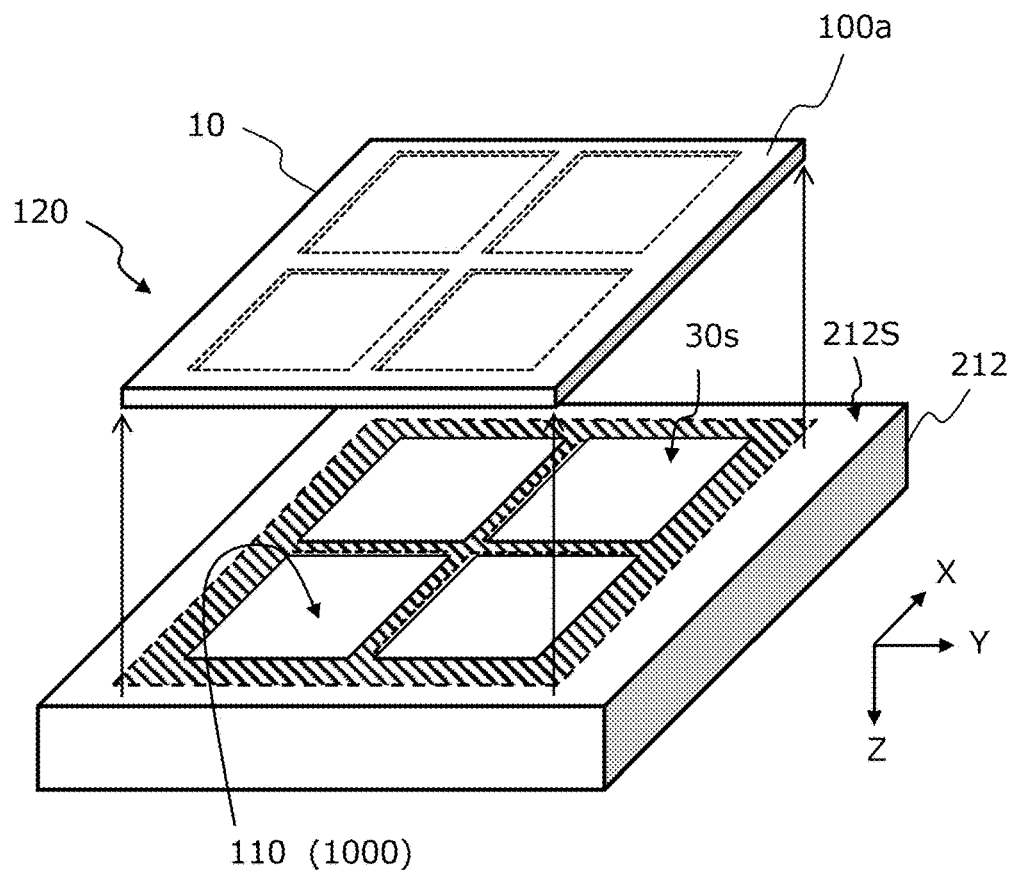
FIG. 13 is a perspective view showing removal of the glass base from the stage.

The multilayer stack 100 which can be used in the production method of the present disclosure is not limited to the example illustrated in FIG. 1A and FIG. 13. FIG. 1C and FIG. 1D are cross-sectional views showing other examples of the multilayer stack 100. In the example illustrated FIG. 1C, the protection sheet 50 covers the entirety of the plastic film 30 and extends outward beyond the plastic film 30. In the example illustrated FIG. 1D, the protection sheet 50 covers the entirety of the plastic film 30 and extends outward beyond the glass base 10. As will be described later, after the glass base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the glass base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

<Dividing of OLED Devices>

According to the flexible OLED device production method of the present embodiment, after the step of providing the above-described multilayer stack 100, the step of dividing an intermediate region 30i and respective ones of a plurality of flexible substrate regions 30d of the plastic film 30 from one another is carried out.

Figure 2:
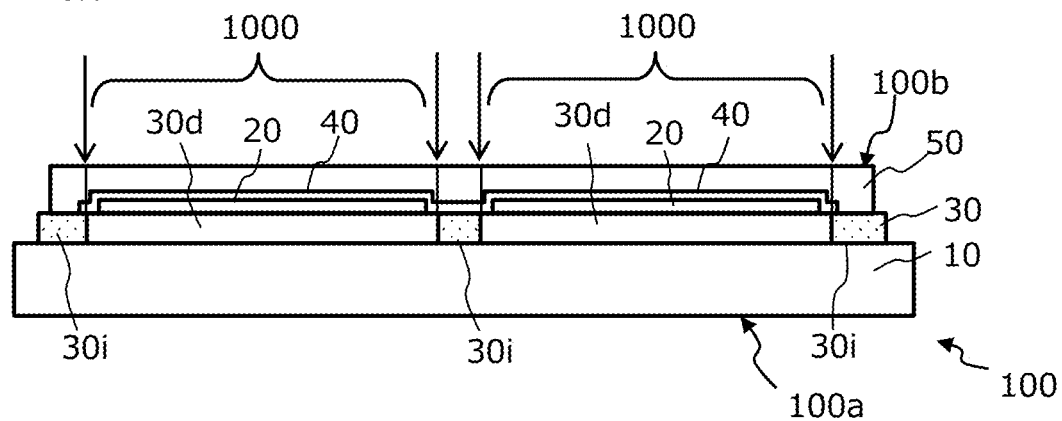
FIG. 2 is a cross-sectional view schematically showing the dividing positions in the multilayer stack.

FIG. 2 is a cross-sectional view schematically showing the positions for dividing the intermediate region 30i and respective ones of the plurality of flexible substrate regions 30d of the plastic film 30 from one another. The positions of irradiation extend along the periphery of each of the flexible substrate regions 30d. In FIG. 2, the positions indicated by arrows are irradiated with a laser beam for cutting. Part of the multilayer stack 100 exclusive of the glass base 10 is cut into a plurality of OLED devices 1000 and the remaining unnecessary portions. By cutting, a gap of several tens of micrometers to several hundreds of micrometers is formed between each of the OLED devices 1000 and a portion surrounding the OLED device 1000. The cutting can also be realized by a dicing saw instead of the laser beam irradiation. After the cutting, the OLED devices 1000 and the remaining unnecessary portions are still bound to the glass base 10.

When the cutting is realized by a laser beam, the wavelength of the laser beam may be in any of the infrared, visible and ultraviolet bands. From the viewpoint of reducing the effect of the cutting on the glass base 10, the laser beam desirably has a wavelength in the range of green to ultraviolet. For example, when a Nd:YAG laser device is used, the cutting can be carried out using a second harmonic wave (wavelength: 532 nm) or a third harmonic wave (wavelength: 343 nm or 355 nm). In such a case, the laser power is adjusted to 1 to 3 watts, and the scanning rate is set to about 500 mm per second, so that the multilayer structure supported by the glass base 10 can be cut (divided) into OLED devices and unnecessary portions without damaging the glass base 10.

According to the embodiment of the present disclosure, the timing of the above-described cutting is earlier than in the prior art. Since the cutting is carried out while the plastic film 30 is bound to the glass base 10, alignment for the cutting can be made with high precision and accuracy even if the gap between adjoining OLED devices 1000 is narrow. Thus, the gap between adjoining OLED devices 1000 can be shortened, and accordingly, useless portions which are unnecessary for a final product can be reduced. In the prior art, after the delaminating from the glass base 10, a polarizer, a heat radiation sheet, and/or an electromagnetic shield can be adhered to the plastic film 30 so as to cover the entirety of the surface (delaminated surface) of the plastic film 30. In such a case, the polarizer, the heat radiation sheet, and/or the electromagnetic shield are also divided by cutting into portions covering the OLED devices 1000 and the remaining unnecessary portions. The unnecessary portions are disposed of as waste. On the other hand, according to the production method of the present disclosure, production of such waste can be suppressed as will be described later.

<Lift-Off Light Irradiation>

After the intermediate region 30i and respective ones of the plurality of flexible substrate regions 30d of the plastic film 30 are divided from one another, the step of irradiating the interface between the flexible substrate regions 30d of the plastic film 30 and the glass base 10 with laser light is carried out using a delaminating apparatus.

Figure 3A:
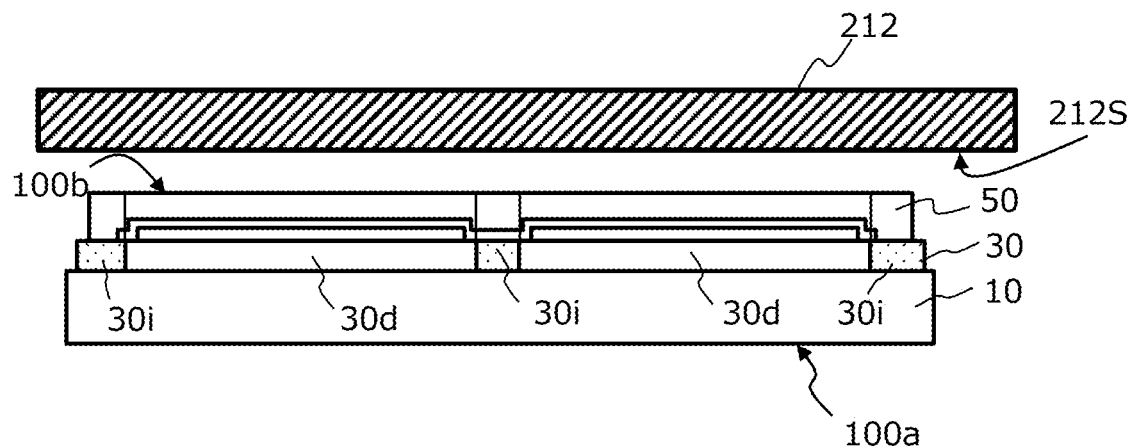
FIG. 3A is a diagram schematically showing a state immediately before a stage supports a multilayer stack.

FIG. 3A schematically shows a state in an unshown production apparatus (delaminating apparatus) immediately before the stage 212 supports the multilayer stack 100. In the present embodiment, the stage 212 is a chuck stage which has a large number of pores in the surface for suction. Details of the configuration of the chuck stage will be described later. The multilayer stack 100 is arranges such that the second surface 100b of the multilayer stack 100 faces the surface 212S of the stage 212, and is supported by the stage 212.

Figure 3B:
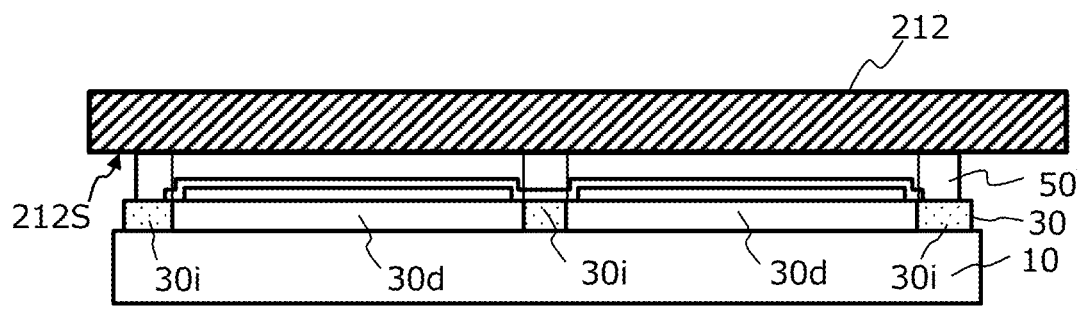
FIG. 3B is a diagram schematically showing a state where the stage supports the multilayer stack.

FIG. 3B schematically shows a state where the stage 212 supports the multilayer stack 100. The arrangement of the stage 212 and the multilayer stack 100 is not limited to the example illustrated in the drawing. For example, the multilayer stack 100 may be placed upside down such that the stage 212 is present under the multilayer stack 100.

In the example illustrated in FIG. 3B, the multilayer stack 100 is in contact with the surface 212S of the stage 212, and the stage 212 holds the multilayer stack 100 by suction.

Figure 3C:
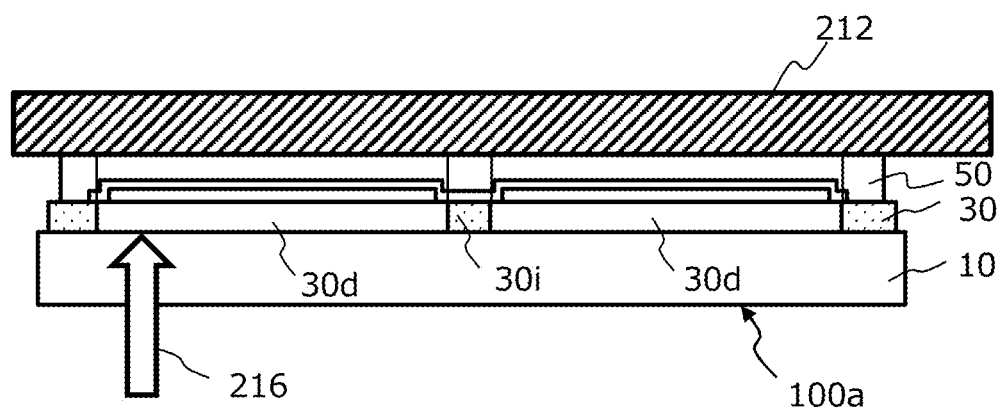
FIG. 3C is a diagram schematically showing that the interface between a glass base and a plastic film of the multilayer stack with laser light (lift-off light) in the shape of a line.

Then, as shown in FIG. 3C, the interface between the plurality of flexible substrate regions 30d of the plastic film 30 and the glass base 10 is irradiated with laser light (lift-off light) 216. FIG. 3C schematically illustrates irradiation of the interface between the glass base 10 and the plastic film 30 of the multilayer stack 100 with the lift-off light 216 in the shape of a line extending in a direction vertical to the sheet of the drawing. A part of the plastic film 30 at the interface between the glass base 10 and the plastic film 30 absorbs the lift-off light 216 and decomposes (disappears). By scanning the above-described interface with the lift-off light 216, the degree of binding of the plastic film 30 to the glass base 10 is reduced. The wavelength of the lift-off light 216 is typically in the ultraviolet band. The wavelength of the lift-off light 216 is selected such that the lift-off light 216 is hardly absorbed by the glass base 10 but is absorbed by the plastic film 30 as much as possible. The light absorption by the glass base 10 is, for example, about 10% in the wavelength range of 343-355 nm but can increase to 30-60% at 308 nm.

In the present embodiment, the delaminating apparatus includes a line beam source for emitting the lift-off light 216. The line beam source includes a laser device and an optical system for shaping laser light emitted from the laser device into a line beam.

Figure 4A:
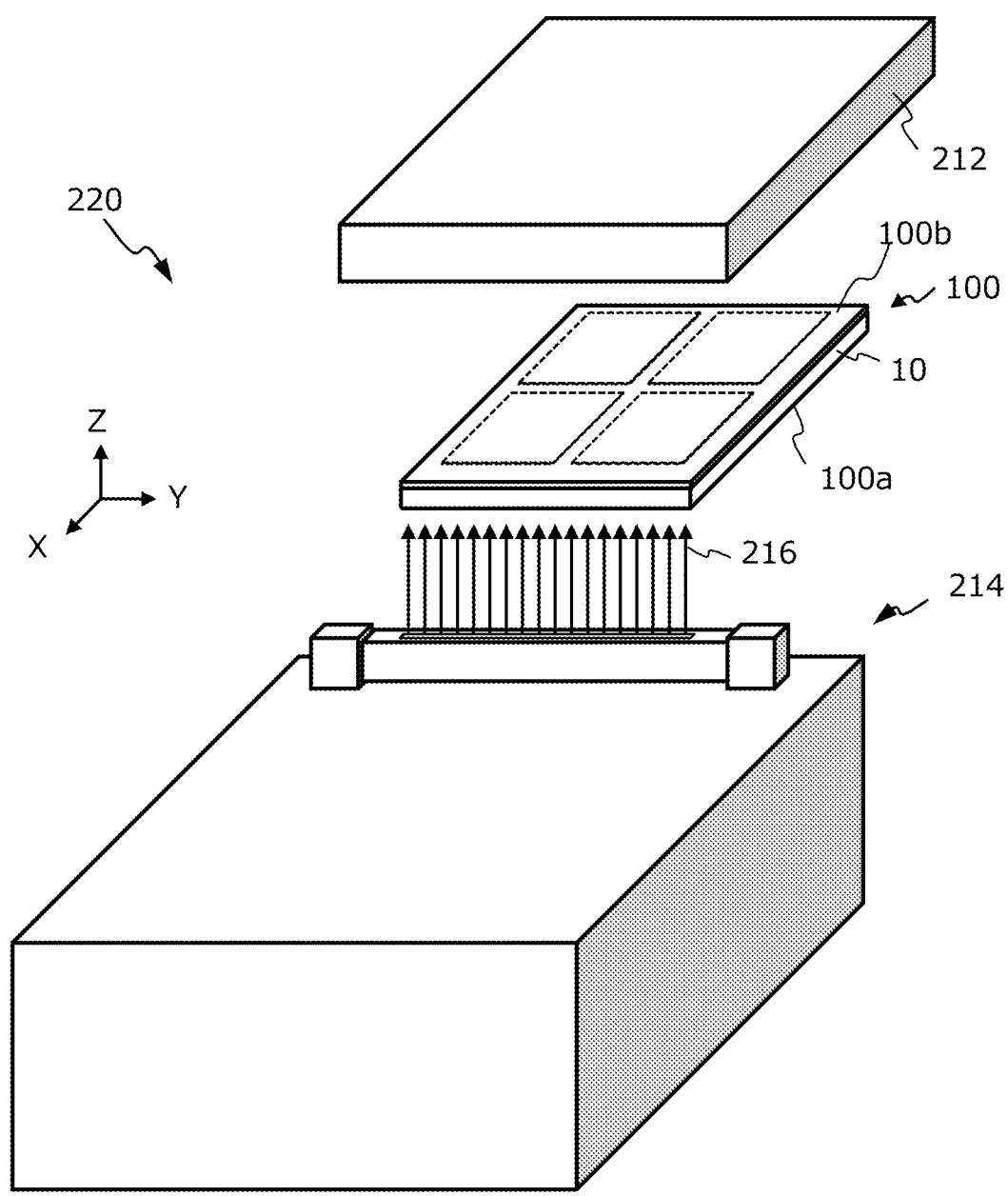
FIG. 4A is a perspective view schematically showing irradiation of the multilayer stack with a line beam emitted from a line beam source of a delaminating apparatus.

FIG. 4A is a perspective view schematically showing irradiation of the multilayer stack 100 with a line beam (lift-off light 216) emitted from a line beam source 214 of a delaminating apparatus 220. For the sake of understandability, the stage 212, the multilayer stack 100 and the line beam source 214 are shown as being spaced away from one another in the Z-axis direction of the drawing. During irradiation with the lift-off light 216, the second surface 100b of the multilayer stack 100 is in contact with the stage 212.

Figure 4B:
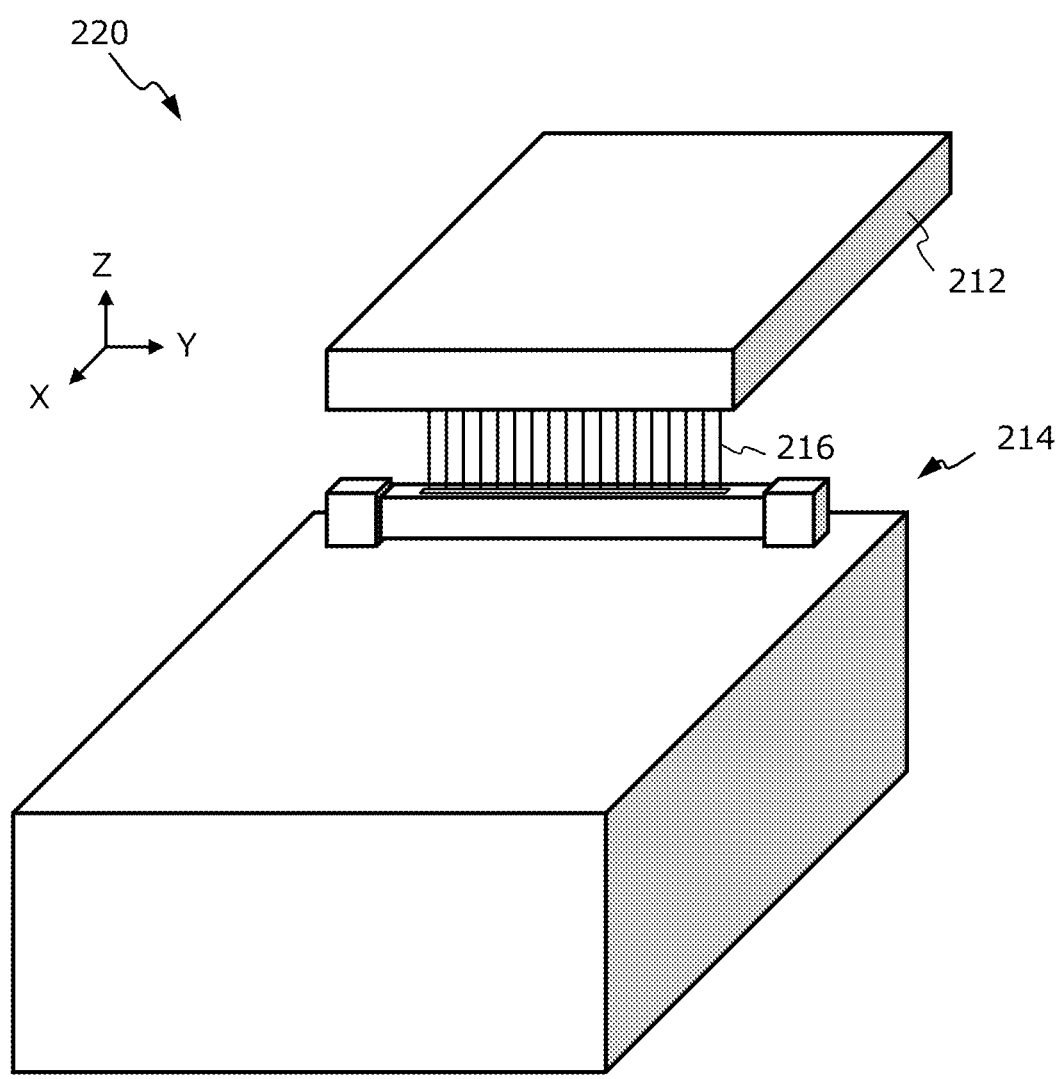
FIG. 4B is a diagram schematically showing the position of the stage at the start of irradiation with lift-off light.

FIG. 4B schematically shows the position of the stage 212 during irradiation with the lift-off light 216. Although not shown in FIG. 4B, the multilayer stack 100 is supported by the stage 212.

Examples of the laser device that emits the lift-off light 216 include gas laser devices such as excimer laser, solid laser devices such as YAG laser, semiconductor laser devices, and other types of laser devices. A XeCl excimer laser device can generate laser light at the wavelength of 308 nm. When yttrium orthovanadate ($YVO_4$) doped with neodymium (Nd) or $YVO_4$ doped with ytterbium (Yb) is used as a lasing medium, the wavelength of laser light (fundamental wave) emitted from the lasing medium is about 1000 nm. Therefore, the fundamental wave can be converted by a wavelength converter to laser light at the wavelength of 340-360 nm (third harmonic wave) before it is used.

A sacrificial layer (a thin layer of a metal or amorphous silicon) may be provided at the interface between the plastic film 30 and the glass base 10. From the viewpoint of suppressing generation of ashes, using laser light at the wavelength of 308 nm from the excimer laser device, rather than laser light at the wavelength of 340-360 nm, is more effective. Providing the sacrificial layer is highly effective in suppressing generation of ashes.

The irradiation with the lift-off light 216 can be carried out with the power density (irradiance) of, for example, 250-300 mJ/cm². The lift-off light 216 in the shape of a line beam has a size which can extend across the glass base 10, i.e., a line length which exceeds the length of one side of the glass base (long axis dimension, size in Y-axis direction of FIG. 4B). The line length can be, for example, not less than 750 mm. Meanwhile, the line width of the lift-off light 216 (short axis dimension, size in X-axis direction of FIG. 4B) can be, for example, about 0.2 mm. These dimensions represent the size of the irradiation region at the interface between the plastic film 30 and the glass base 10. The lift-off light 216 can be emitted in the form of a pulsed or continuous wave. Irradiation with the pulsed wave can be carried out at the frequency of, for example, about 200 times per seconds.

Figure 4C:
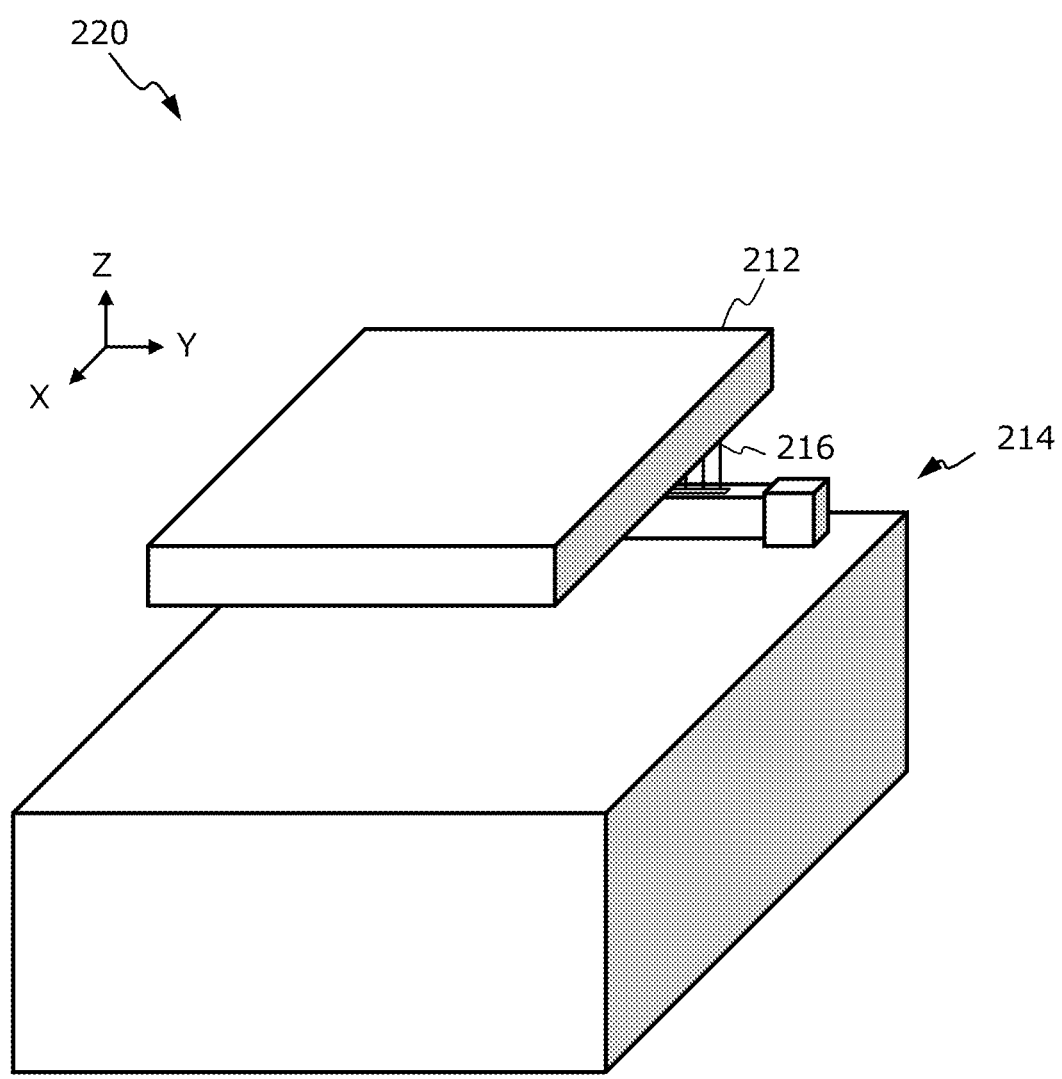
FIG. 4C is a diagram schematically showing the position of the stage at the end of irradiation with lift-off light.

The position of irradiation with the lift-off light 216 moves relative to the glass base 10 for scanning with the lift-off light 216. In the delaminating apparatus 220, the multilayer stack 100 may be movable while the light source 214 from which the lift-off light is to be emitted and an optical unit (not shown) are stationary, and vice versa. In the present embodiment, irradiation with the lift-off light 216 is carried out during a period where the stage 212 moves from the position shown in FIG. 4B to the position shown in FIG. 4C. That is, scanning with the lift-off light 216 is carried out by movement of the stage 212 in the X-axis direction.

<Lift-Off>

Figure 5A:
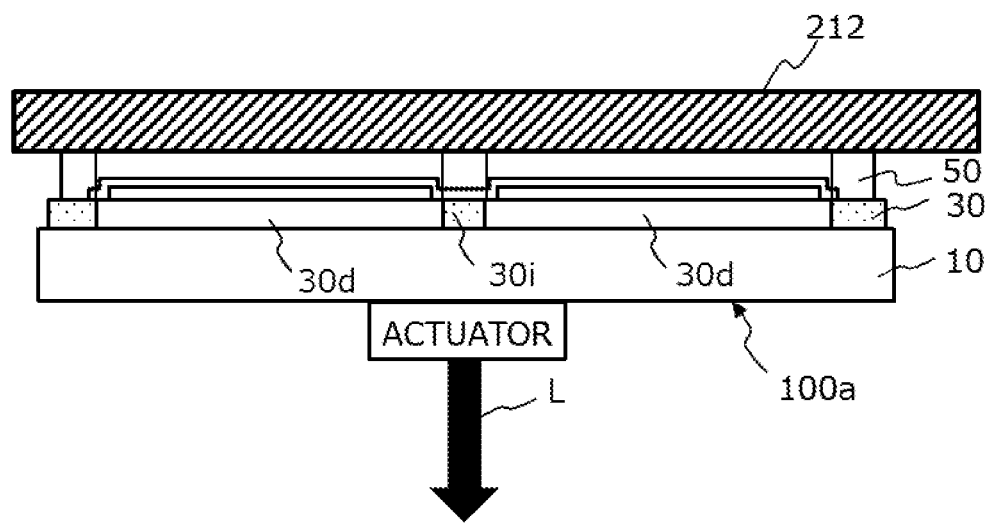
FIG. 5A is a cross-sectional view schematically showing the multilayer stack before the multilayer stack is separated into the first portion and the second portion after irradiation with lift-off light.

FIG. 5A illustrates a state where the multilayer stack 100 is in contact with the stage 212 after irradiation with the lift-off light. While this state is maintained, the distance from the stage 212 to the glass base 10 is increased. At this point in time, the stage 212 of the present embodiment holds an OLED device portion of the multilayer stack 100. At this point in time, a part of the intermediate region 30i located at an end of the plastic film 30 may be secured to the glass base 10 using an unshown pin or jig. The securing positions can be, for example, at the four corners of the plastic film 30.

An actuator holds the glass base 10 and moves the entirety of the glass base 10 in the direction of arrow L, thereby carrying out delaminating (lift-off). The glass base 10 can be moved together with an unshown chuck stage while being adhered by suction to the chuck stage. The direction of movement of the glass base 10 does not need to be vertical, but may be diagonal, to the first surface 100a of the multilayer stack 100. The movement of the glass base 10 does not need to be linear but may be rotational. Alternatively, the stage 212 may be moved upward in the drawing while the glass base 10 is secured by an unshown holder or another stage.

Figure 5B:
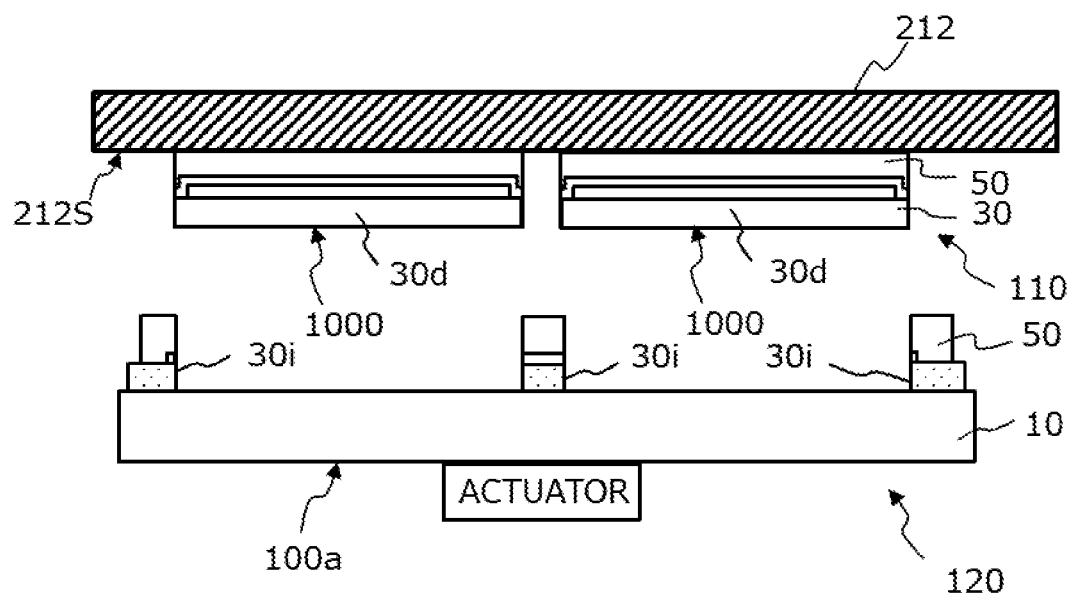
FIG. 5B is a cross-sectional view schematically showing the multilayer stack separated into the first portion and the second portion.
Figure 6:
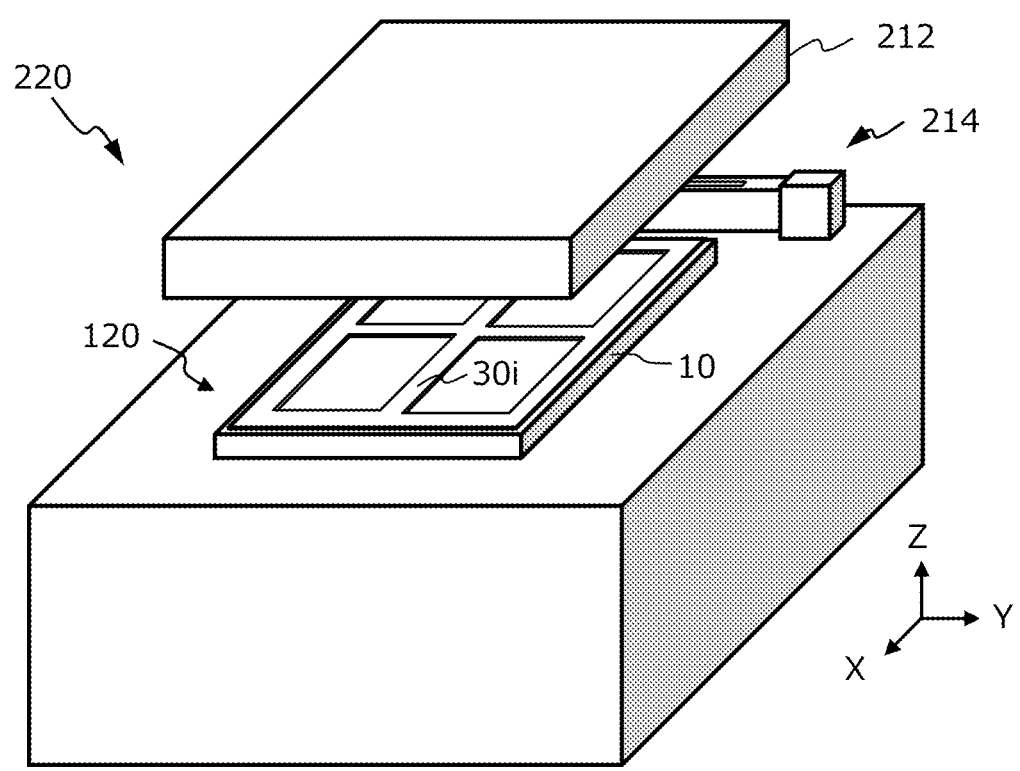
FIG. 6 is a perspective view showing the glass base separated from the multilayer stack by the delaminating apparatus.

FIG. 5B is a cross-sectional view showing the thus-separated first portion 110 and second portion 120 of the multilayer stack 100. FIG. 6 is a perspective view showing the second portion 120 of the multilayer stack 100. The first portion 110 of the multilayer stack 100 includes a plurality of OLED devices 1000 which are in contact with the stage 212. The respective OLED devices 1000 include the functional layer regions 20 and the plurality of flexible substrate regions 30d of the plastic film 30. Meanwhile, the second portion 120 of the multilayer stack 100 includes the glass base 10 and the intermediate region 30i of the plastic film 30.

In the example of FIG. 6, both the irradiation process with the lift-off light and the delaminating process are carried out using the delaminating apparatus 220 that includes the stage 212. The embodiment of the present disclosure is not limited to this example. The irradiation process with the lift-off light may be carried out using a lift-off light irradiation unit which includes a stage other than the stage 212, while the delaminating process is carried out using the delaminating apparatus that includes the stage 212. In this case, after irradiation with the lift-off light, it is necessary to transfer the multilayer stack 100 from the stage of the irradiation unit to the stage 212. When the same stage is used for carrying out both the irradiation process with the lift-off light and the delaminating process, the step of transferring the multilayer stack between the stages can be omitted.

As described above, in the present embodiment, the step of separating the multilayer stack 100 into the first portion 110 and the second portion 120 is carried out while the stage 212 holds the second surface 100b of the multilayer stack 100 by suction. The essence of this separation step resides in that an unnecessary part of the multilayer stack 100 which is not a constituent of the OLED device 1000 separates together with the glass base 10 from the stage 212. In the present embodiment, the cutting step illustrated in FIG. 2, i.e., the step of cutting a part of the multilayer stack 100 exclusive of the glass base 10 into the plurality of OLED devices 1000 and the remaining unnecessary portions, is carried out before irradiation with the lift-off light. Carrying out the cutting step before the lift-off light irradiation step is effective in realizing the separation illustrated in FIG. 5B and FIG. 6.

In the present embodiment, the stage 212 plays an important role in the above-described "separation". Hereinafter, a configuration example of the stage 212 which can be suitably used in the present embodiment is described.

Configuration Example 1 of Stage

Figure 7:
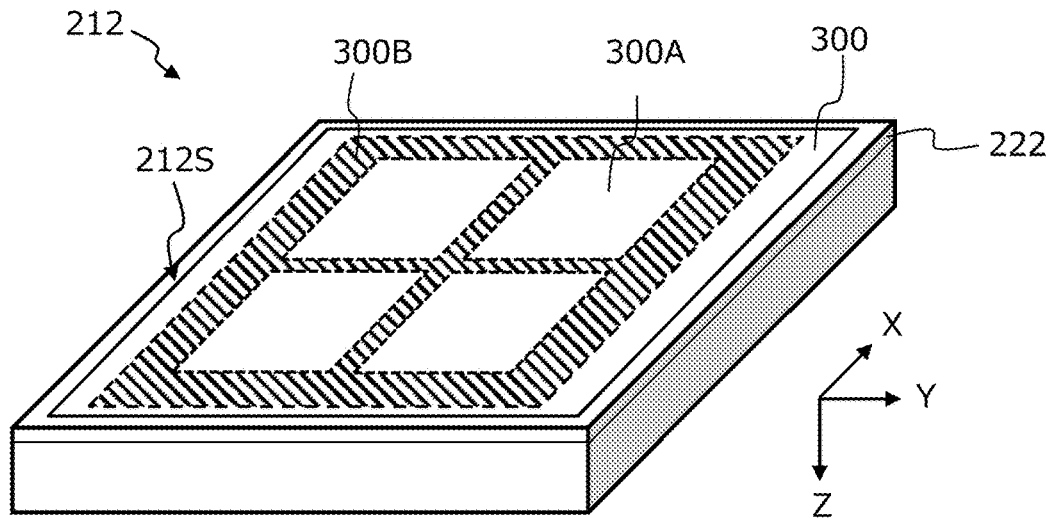
FIG. 7 is a perspective view schematically showing a surface of the stage.
Figure 8:
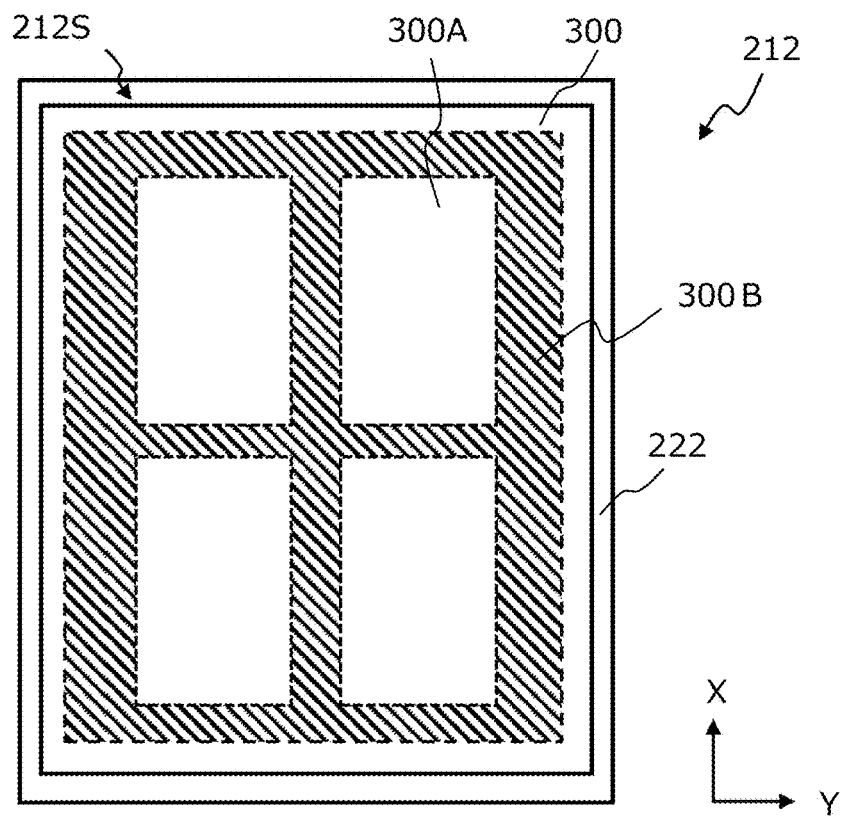
FIG. 8 is a plan view schematically showing the surface of the stage.

FIG. 7 is a perspective view schematically showing a surface of the stage 212 in this example. FIG. 8 is a plan view schematically showing the surface of the stage 212. The stage 212 shown in the drawings includes a plurality of first regions 300A which are to respectively face a plurality of OLED devices 1000 (not shown) and a second region 300B which is to face the intermediate region 30i of the plastic film 30. The suction in the first regions 300A is greater than the suction in the second region 300B.

Figure 9A:
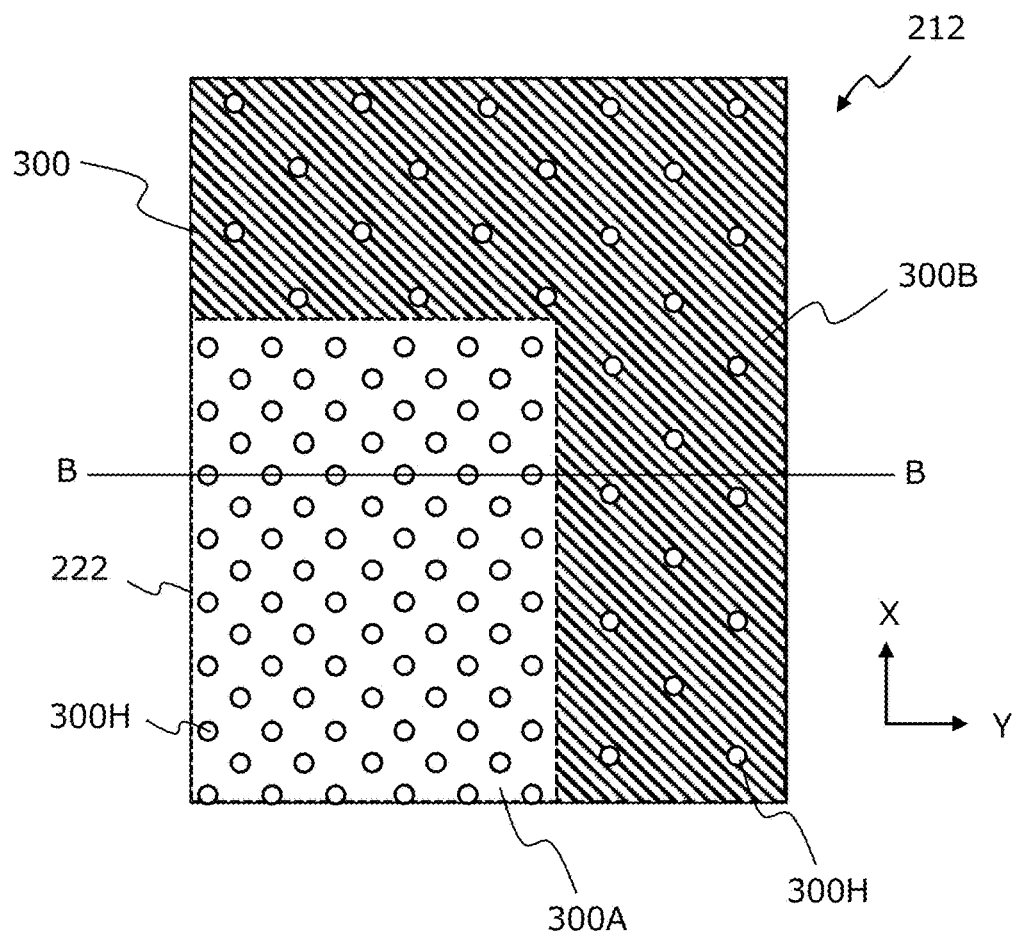
FIG. 9A is a schematic diagram enlargedly showing a portion in the vicinity of the boundary between a first region and a second region of the surface in a configuration example of the stage.
Figure 9B:
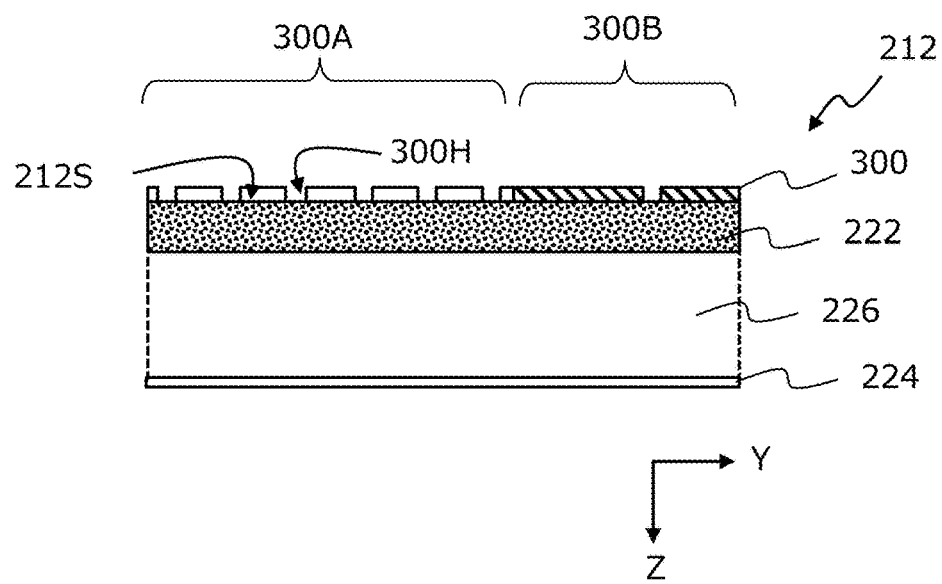
FIG. 9B is a cross-sectional view taken along line B-B of FIG. 9A.

FIG. 9A is a schematic diagram enlargedly showing a portion in the vicinity of the boundary between the first region 300A and the second region 300B. FIG. 9B is a cross-sectional view taken along line B-B of FIG. 9A. In this example, as shown in FIG. 9B, the stage 212 includes a porous front plate 222, a rear plate 224 which is parallel to the front plate 222, a space 226 formed between these plates, and a suction sheet 300 placed on the front plate 222. The space 226 is connected with a suction unit (not shown), such as a pump. During operation, the suction unit makes the space 226 have a negative pressure, so that external air flows into the space 226 via a large number of voids of the porous front plate 222 and openings (through holes 300H) of the suction sheet 300. Therefore, an object which is in contact with the suction sheet 300 is sucked by the stage 212 and hence adhered by suction to the stage 212.

The porous front plate 222 can be made of various porous materials. The porosity of the porous material is in the range of, for example, not less than 20% and not more than 60%. The average pore diameter is in the range of, for example, not less than 5 μm and not more than 600 μm. An example of the porous material is a sintered metallic or ceramic mass or a resin. The thickness of the porous material that forms the front plate 222 is in the range of, for example, not less than 1 mm and not more than 50 mm.

The suction sheet 300 has a plurality of through holes 300H as shown in FIG. 9A and FIG. 9B. The aperture ratio of the through holes 300H is different between the first region 300A which is in contact with the OLED device 1000 and the second region 300B which is to face the intermediate region 30i of the plastic film 30. The "aperture ratio" of the suction sheet 300 refers to the area proportion of a region (opening) in which the porous front plate 222 is exposed such that the suction function can be performed in the surface of the stage 212.

The suction sheet 300 can be made of various materials such as, for example, PET (polyethylene terephthalate), PVC (polyvinyl chloride), PP (polypropylene), fluoric resins (e.g., Polyflon), polyimide (PI), PC (polycarbonate), ABS resins. Alternatively, the suction sheet 300 may be made of woven fabric, nonwoven fabric, a porous film, or the like. The thickness of the suction sheet 300 can be, for example, about 0.05-3.0 mm.

The surface of the porous front plate 222 can achieve generally uniform sucking force. When the suction sheet 300 is placed, the suction differs between the first region 300A and the second region 300B. A region of the surface of the front plate 222 which is covered with unopened portions of the suction sheet 300 is incapable of sucking air and hence does not create suction. The suction sheet 300 can be used while it is adhered by suction to the porous front plate 222.

The method of securing the suction sheet 300 to the surface of the front plate 222 is not limited to suction. The suction sheet 300 may be secured to the front plate 222 or the stage 212 via an adhesive layer or a jig.

Using the suction sheet 300 in combination with an existing chuck stage easily allows various designs of the multilayer stack 100. For example, when the shape, dimensions, number or arrangement pattern of the OLED devices 1000 is changed, the suction sheet is replaced by another suction sheet which is suitable to this change, whereby the in-plane distribution of the suction of the stage 212 can be easily changed. In other words, it is only necessary to replace the suction sheet 300 without changing the entirety of the stage 212.

In the present embodiment, the in-plane number density (hereinafter, simply referred to as "density") of the through holes 300H in the first region 300A of the suction sheet 300 is higher than the density of the through holes 300H in the second region 300B. In other words, the aperture ratio of the first region 300A is higher than the aperture ratio of the second region 300B. Therefore, the suction (sucking force) in the second region 300B is smaller than the suction in the first region 300A. The density of the through holes in the second region 300B is about 0-50%, preferably about 0-30%, of the density of the through holes 300H in the first region 300A. In one embodiment, the density of the through holes 300H in the second region 300B may be 0/cm$^2$.

The method of varying the suction between the first region 300A and the second region 300B is not limited to making difference in density of the through holes 300H in the suction sheet 300. By making difference in size and/or shape of the through holes 300H, difference can be made in aperture ratio, whereby the suction can be adjusted. Further, by making the thickness of the second region 300B of the suction sheet 300 smaller than the thickness of the first region 300A, a gap may be formed between the multilayer stack 100 and the second region 300B when the multilayer stack 100 is in contact with the first region 300A. Due to the presence of such a gap, the suction in the second region 300B can be decreased.

By using the stage 212 which has the above-described configuration, in the state shown in FIG. 5A, a plurality of flexible substrate regions 30d of the plastic film 30 which are in contact with the first regions 300A of the stage 212 can respectively be adhered by suction to the first regions 300A of the stage 212. Meanwhile, the suction between the intermediate region 30i of the plastic film 30 and the second region 300B of the stage 212 is not strong. The intermediate region 30i of the plastic film 30 is rather attached to the glass base 10. While the interface between the intermediate region 30i of the plastic film 30 and the glass base 10 is irradiated with lift-off light, the intermediate region 30i of the plastic film 30 can be kept attached to the glass base 10 due to intermolecular forces, such as van der Waals force. Further, as previously described, when a part of the intermediate region 30i at an end of the plastic film 30 is secured to the glass base 10 using a pin or jig, the entirety of the intermediate region 30i can easily be kept on the glass base 10.

Further, in irradiating with lift-off light, the irradiation intensity of the lift-off light may be decreased for at least part of the intermediate region 30i of the plastic film 30. If the irradiation intensity of the lift-off light is below a level required for delamination, that part of the intermediate region 30i of the plastic film 30 remains bound to the glass base 10. Thus, the intermediate region 30i of the plastic film 30 can easily be kept on the glass base 10.

If the distance from the stage 212 to the glass base 10 is increased while the stage 212 holds the second surface 100b of the multilayer stack 100 by suction, the unnecessary portions of the multilayer stack 100 can be separated together with the glass base 10 from the OLED devices 1000. The unnecessary portions of the multilayer stack 100 are not adhered by suction to the second region 300B of the stage 212 and remain bound to the glass base 10.

In the configuration example described with reference to FIG. 9A and FIG. 9B, the shape and size of the first region 300A of the suction sheet 300 which is in contact with the OLED device 1000 are identical with the shape and size of the OLED device 1000, although the embodiment of the present disclosure is not limited to this example. If the suction in the first region 300A is sufficiently strong, the first region 300A only needs to face at least part of the OLED device 1000, rather than the entirety of the OLED device 1000.

Figure 10:
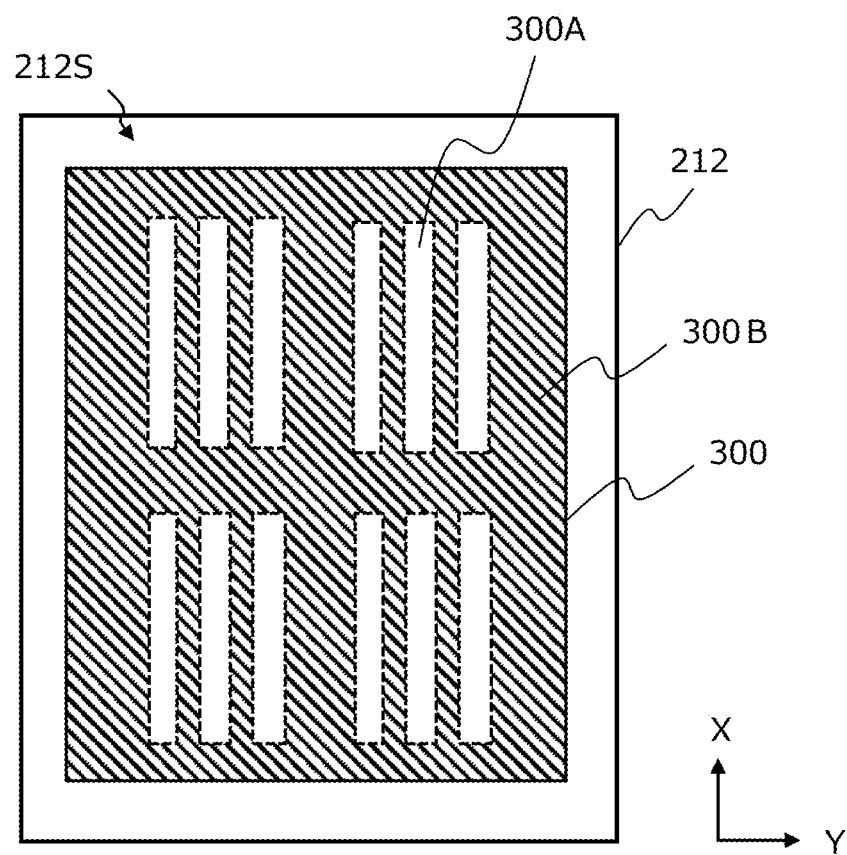
FIG. 10 is a plan view showing the surface in another configuration example of the stage.

FIG. 10 is a plan view showing a suction sheet 300 in another configuration example. The first regions 300A of the suction sheet 300 can have an arbitrary shape and dimensions so long as the first regions 300A hold by suction respective ones of the OLED devices 1000 included in the multilayer stack 100 and do not come into contact with the intermediate region 30i of the plastic film 30.

Figure 11A:
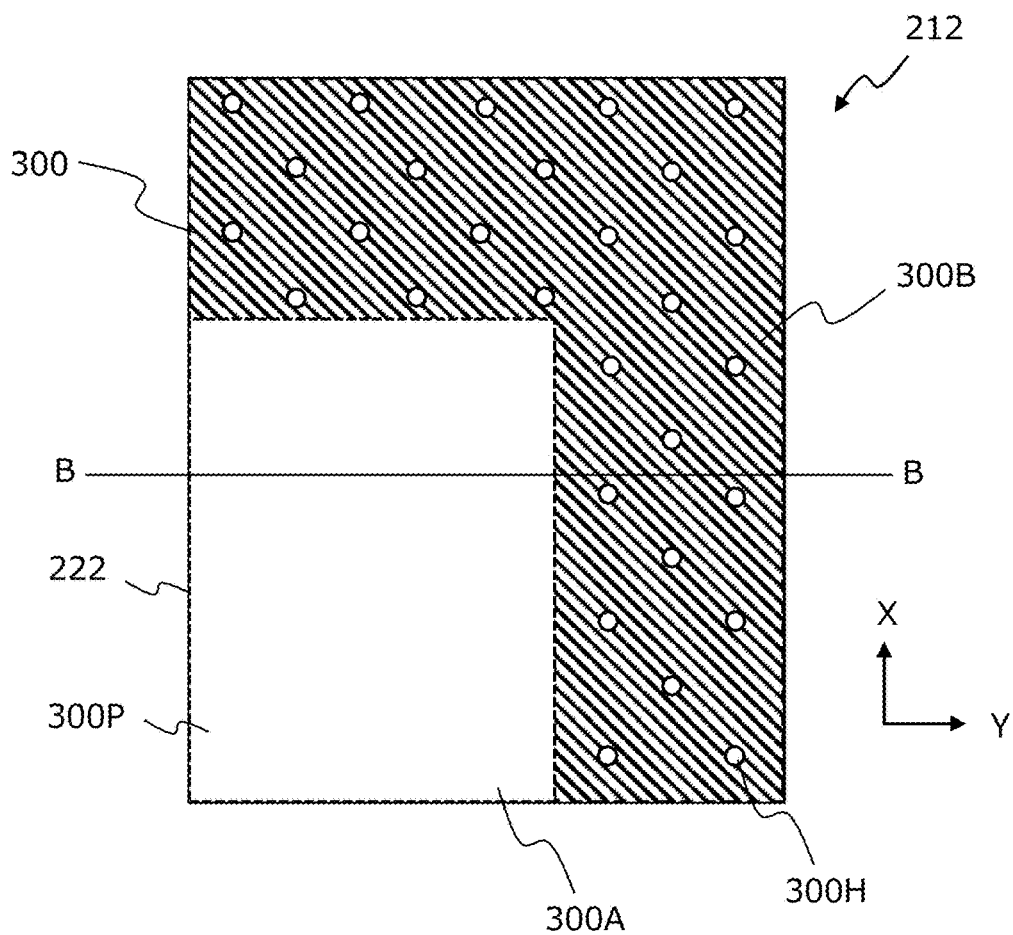
FIG. 11A is a schematic diagram enlargedly showing a portion in the vicinity of the boundary between a first region and a second region of the surface in still another configuration example of the stage.
Figure 11B:
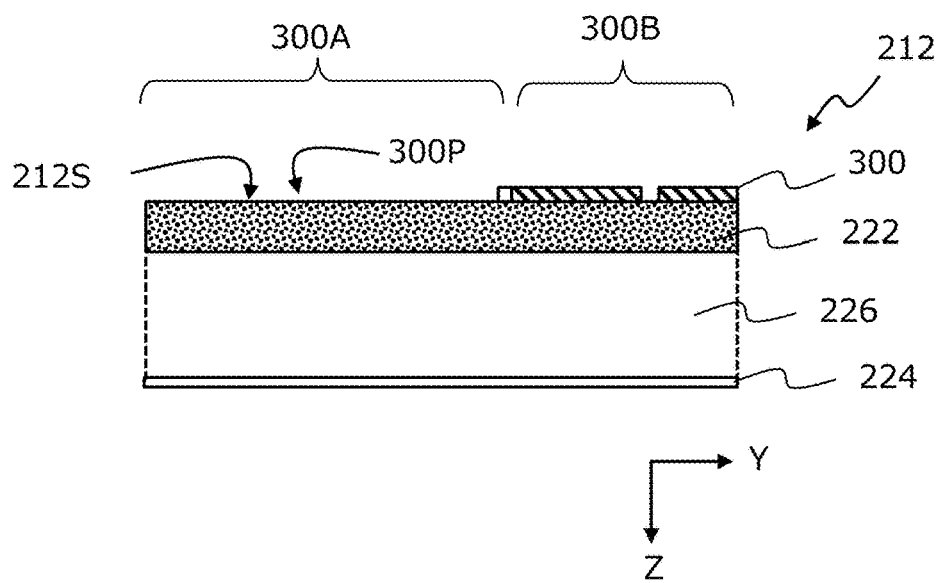
FIG. 11B is a cross-sectional view taken along line B-B of FIG. 11A.

FIG. 11A is a schematic diagram enlargedly showing a portion in the vicinity of the boundary between the first region 212A and the second region 212B in another configuration example of the suction sheet 300. FIG. 11B is a cross-sectional view taken along line B-B of FIG. 11A. In this example, the first region 300A is defined by a large opening 300P through which the surface 212S of the front plate 222 that is made of a porous material is exposed. Meanwhile, the second region 300B covers the surface 212S of the front plate 222 that is made of a porous material, thereby performing the function of reducing the suction. In the example illustrated in the drawings, the second region 300B has the through holes 300H, although the through holes 300H are not indispensable in the second region 300B.

Configuration Example 2 of Stage

Figure 12A:
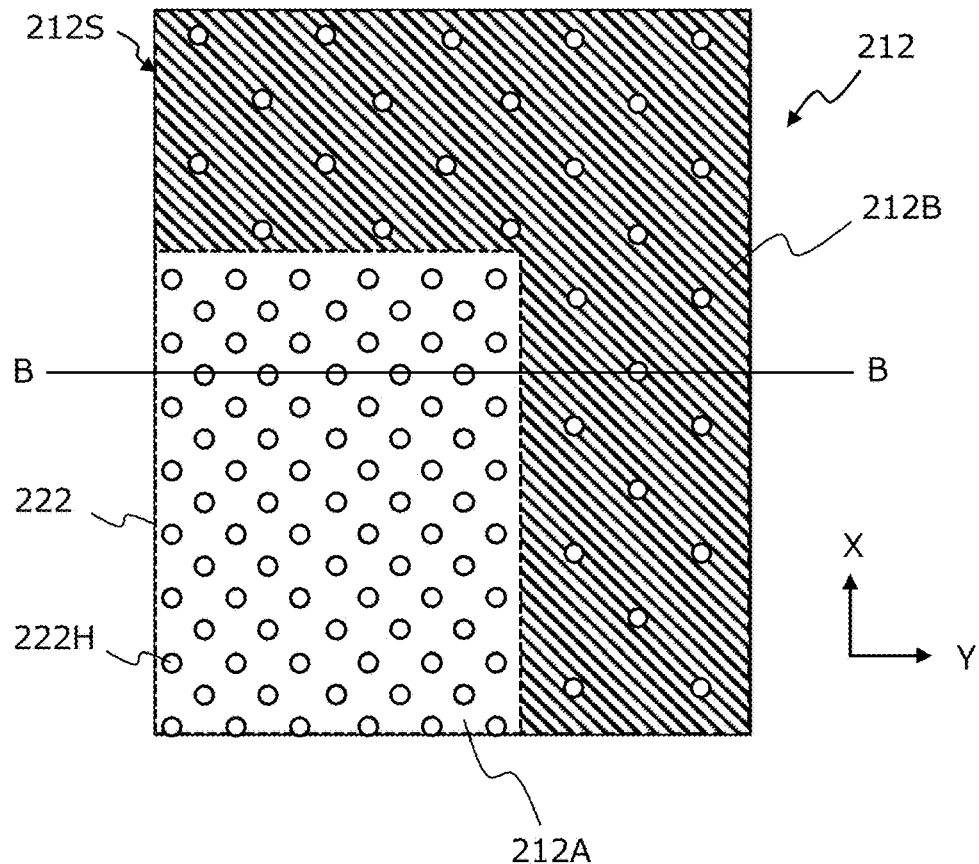
FIG. 12A is a schematic diagram enlargedly showing a portion in the vicinity of the boundary between a first region and a second region of the surface in another configuration example of the stage.
Figure 12B:
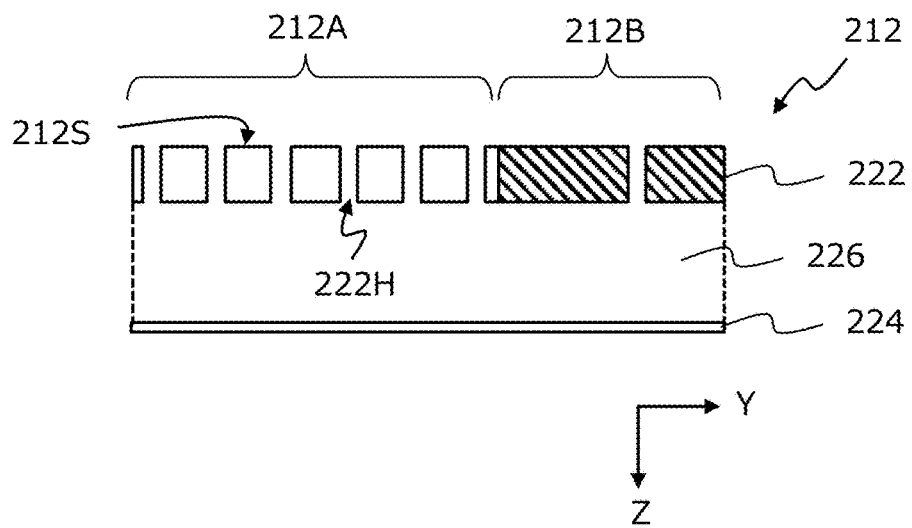
FIG. 12B is a cross-sectional view taken along line B-B of FIG. 12A.

FIG. 12A is a schematic diagram enlargedly showing a portion in the vicinity of the boundary between the first region 212A and the second region 212B in a stage 212 in which the front plate 222 is realized by a plate which has through holes, rather than a plate which is made of a porous material. FIG. 12B is a cross-sectional view taken along line B-B of FIG. 12A.

In this example, the density or aperture ratio of through holes 300H in the first region 212A is higher than the density or aperture ratio of through holes 300H in the second region 212B. Thus, the suction in the second region 212B is smaller than the suction in the first region 212A.

As described herein, the stage 212 may have a plurality of regions of different suctions.

<Steps after Delaminating>

FIG. 13 is a perspective view showing the first portion 110 (OLED devices 1000) of the multilayer stack 100 adhered by suction to the stage 212 and the second portion 120 (the glass base 10 and objects bound thereto) at a position distant from the stage 212. Unnecessary portions of the multilayer stack 100 which are not constituents of the OLED devices 1000 are bound to the glass base 10.

Figure 14:
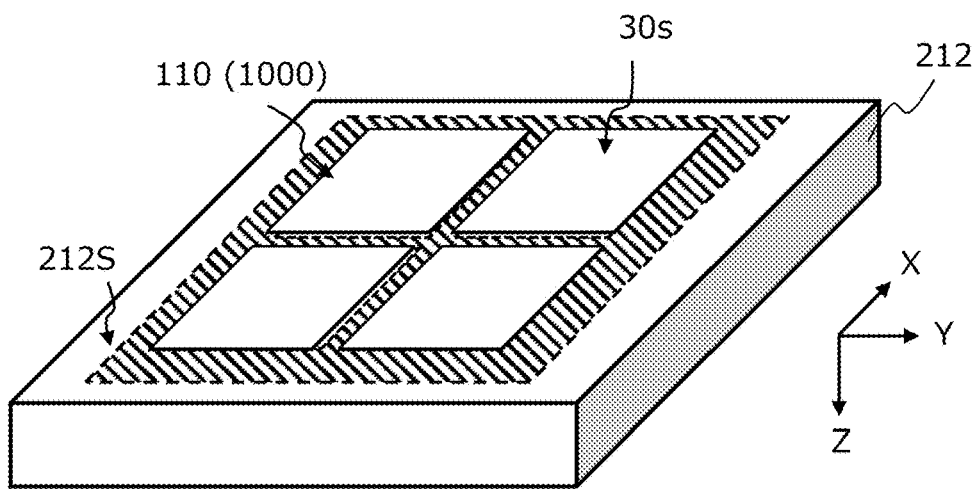
FIG. 14 is a perspective view showing the stage from which the glass base has been removed.

FIG. 14 is a perspective view showing the first portion 110 of the multilayer stack 100 adhered by suction to the stage 212. The first portion 110 of the multilayer stack 100 supported by the stage 212 includes a plurality of OLED devices 1000 arrayed in rows and columns. In the example of FIG. 14, a part of the plastic film 30, specifically the surface (delaminated surface) 30S of the flexible substrate regions 30d, is exposed.

Figure 15:
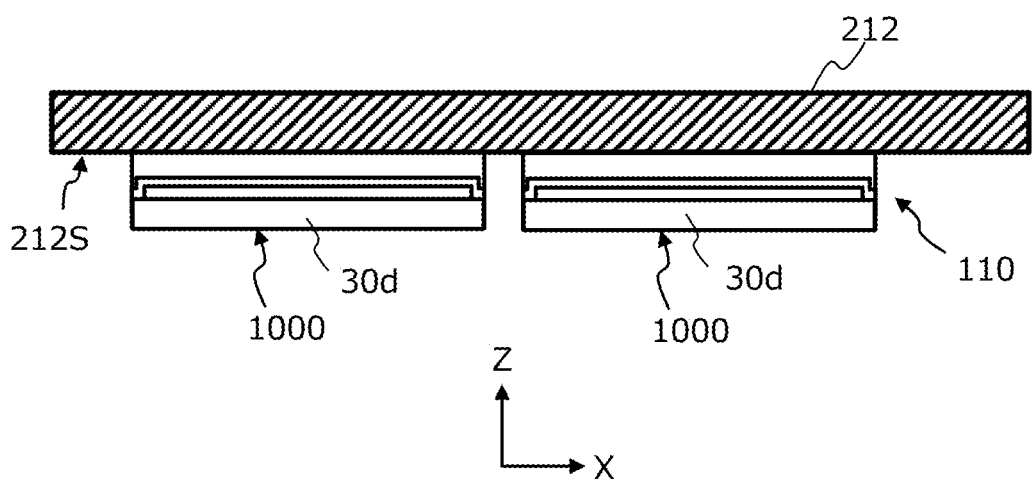
FIG. 15 is a cross-sectional view showing the stage from which the glass base has been removed.

FIG. 15 is a cross-sectional view showing that the stage 212 holds the OLED devices 1000 by suction. This cross section is parallel to the ZX plane. The direction of the Z-axis of FIG. 15 is opposite to the direction of the Z-axis of FIG. 13 and FIG. 14.

Various processes can be sequentially or concurrently performed on the plurality of OLED devices 1000 which are in contact with the stage 212.

The "processes" to be performed on the OLED devices 1000 can include attaching a dielectric and/or electrically-conductive film to each of the plurality of OLED devices 1000, cleaning or etching each of the plurality of OLED devices 1000, and mounting an optical part and/or an electronic part to each of the plurality of OLED devices 1000. Specifically, a part such as, for example, a polarizer, encapsulation film, touchscreen, heat radiation sheet, electromagnetic shield, driver integrated circuit, or the like, can be mounted to the flexible substrate region 30d of each of the OLED devices 1000. The sheet-like part includes a functional film which can add an optical, electrical or magnetic function to the OLED devices 1000.

The plurality of OLED devices 1000 are supported by the stage 212 such that the OLED devices 1000 are adhered by suction to the stage 212. The various processes which are to be performed on each of the OLED devices 1000 can be efficiently carried out.

The surface 30s of the plastic film 30 delaminated from the glass base 10 is active. Therefore, the surface 30s may be covered with a protection film or subjected to a surface treatment for conversion to a hydrophobic surface before various parts are mounted to the surface 30s.

Figure 16:
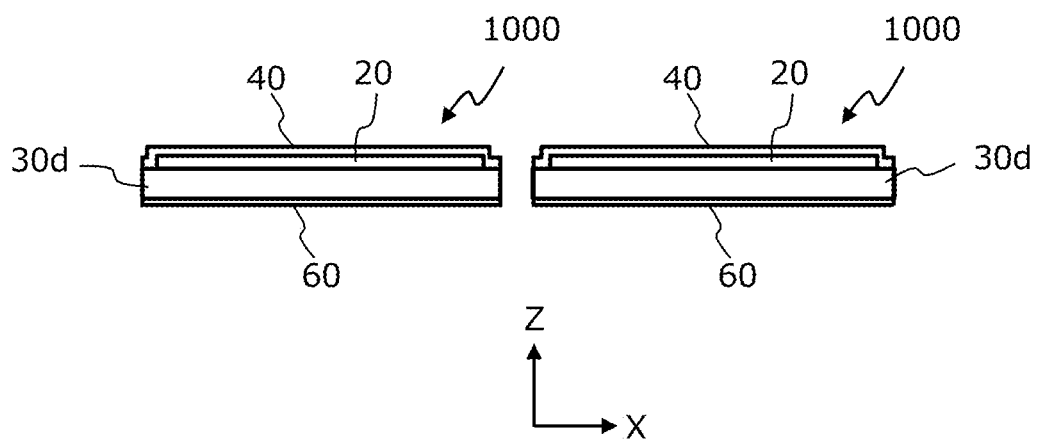
FIG. 16 is a cross-sectional view showing flexible OLED devices detached from the stage.

FIG. 16 is a cross-sectional view schematically showing the OLED devices 1000 detached from the stage 212 after the sheet-like part (functional film) 60 is mounted to the OLED devices 1000.

According to the prior art, the plastic film is delaminated from the glass base before the OLED devices 1000 are divided from one another. Therefore, when a subsequent process is carried out, a large number of OLED devices 1000 are bound to a single plastic film. Thus, it is difficult to carry out an efficient process on each of the OLED devices 1000. When the OLED devices 1000 are divided from one another after the sheet-like part is attached, a portion of the sheet-like part which is present in an intermediate region between adjoining two of the OLED devices 1000 is useless.

On the other hand, according to the embodiment of the present disclosure, a large number of OLED devices 1000 are still orderly arrayed on the stage 212 after being delaminated from the glass base 10. Therefore, various processes can be efficiently performed on the OLED devices 1000 sequentially or concurrently.

Figure 17:
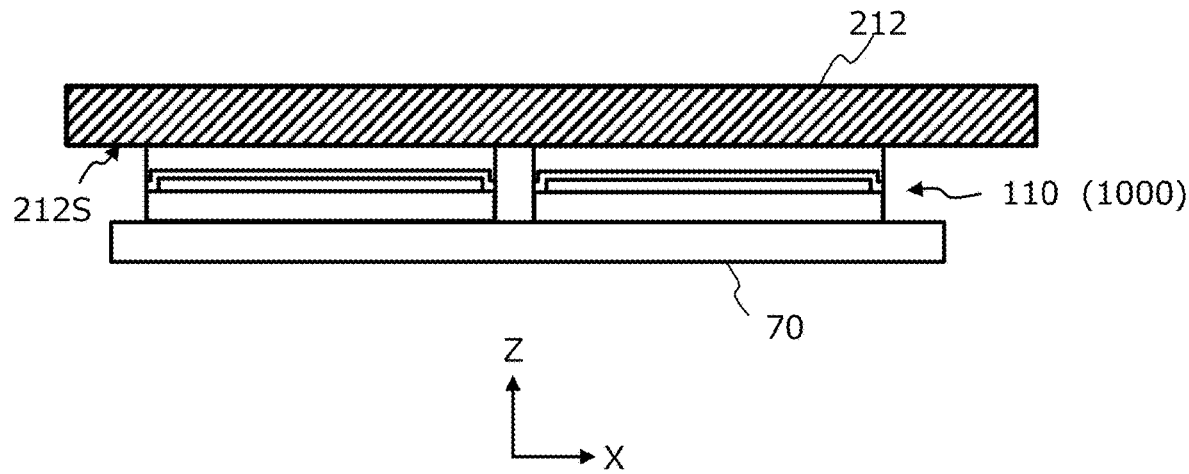
FIG. 17 is a cross-sectional view showing another protection sheet bound to a plurality of OLED devices which are in contact with the stage.

After the step of separating the multilayer stack 100 into the first portion 110 and the second portion 120, the step of adhering another protection sheet (second protection sheet) 70 to the plurality of OLED devices 1000 which are in contact with the stage 212 may be further performed as shown in FIG. 17. The second protection sheet 70 can perform the function of temporarily protecting the surface of the flexible substrate regions 30d of the plastic film 30 delaminated from the glass base 10. The second protection sheet 70 can have the same laminate structure as that of the previously-described protection sheet 50. The protection sheet 50 can be referred to as "first protection sheet 50".

The second protection sheet 70 may be adhered to the plurality of OLED devices 1000 after various processes which have previously been described are performed on the plurality of OLED devices 1000 which are in contact with the stage 212.

When suction of the OLED devices 1000 by the stage 212 is stopped after the second protection sheet 70 is adhered, the plurality of OLED devices 1000 which are bound to the second protection sheet 70 can be detached from the stage 212. Thereafter, the second protection sheet 70 can function as a carrier for the plurality of OLED devices 1000. This is transfer of the OLED devices 1000 from the stage 212 to the second protection sheet 70. Various processes may be sequentially or concurrently performed on the plurality of OLED devices 1000 which are bound to the second protection sheet 70.

Figure 18:
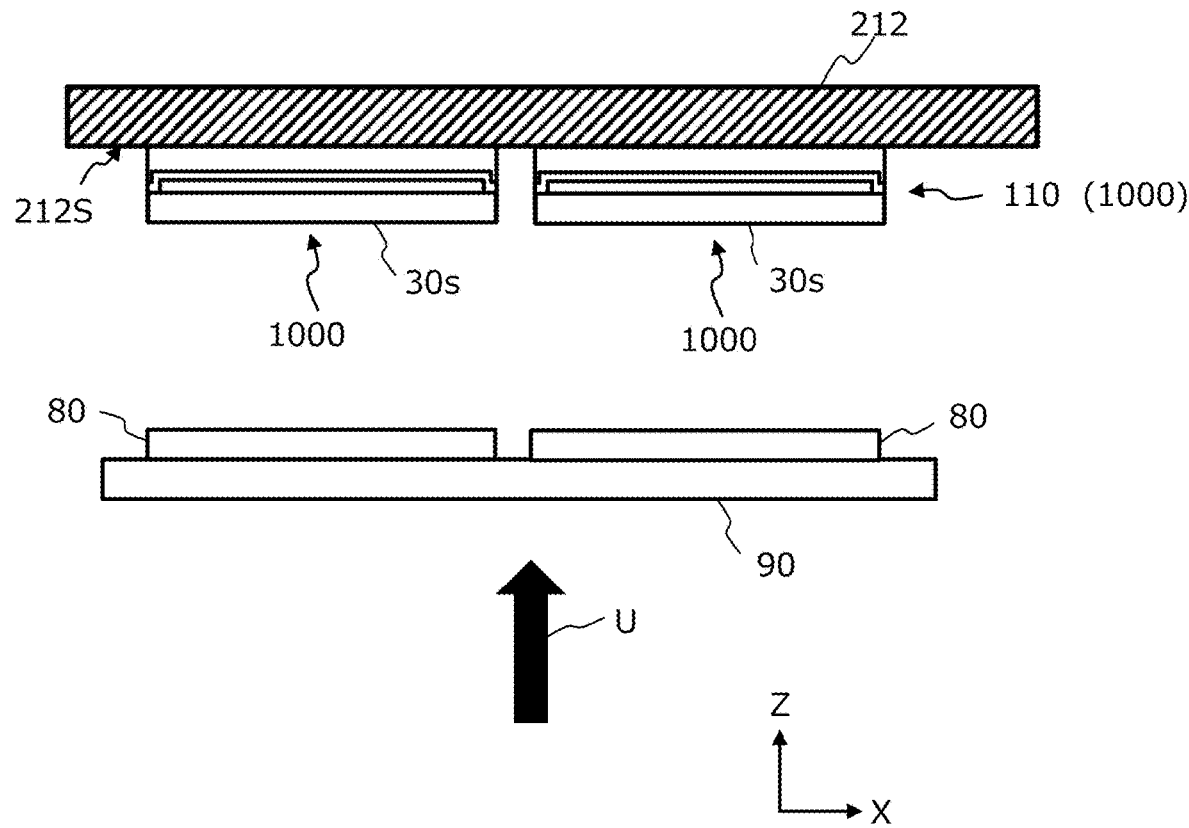
FIG. 18 is a cross-sectional view showing a carrier sheet carrying a plurality of parts which are to be mounted to the plurality of OLED devices.

FIG. 18 is a cross-sectional view showing a carrier sheet 90 carrying a plurality of parts (functional films) 80 which are to be mounted to the plurality of OLED devices 1000. By moving this carrier sheet 90 in the direction of arrow U, the respective parts 80 can be attached to the OLED devices 1000. The upper surface of the parts 80 has an adhesive layer which is capable of strongly adhering to the OLED devices 1000. Meanwhile, the adhesion between the carrier sheet 90 and the parts 80 is relatively weak. Using such a carrier sheet 90 enables a simultaneous "transfer" of the parts 80. Such a transfer is readily realized because the plurality of OLED devices 1000 are regularly arrayed on the stage 212 while the OLED devices 1000 are supported by the stage 212.

Multilayer Stack

Hereinafter, the configuration of the multilayer stack 100 before the dividing of FIG. 2 is described in more detail.

Figure 19A:
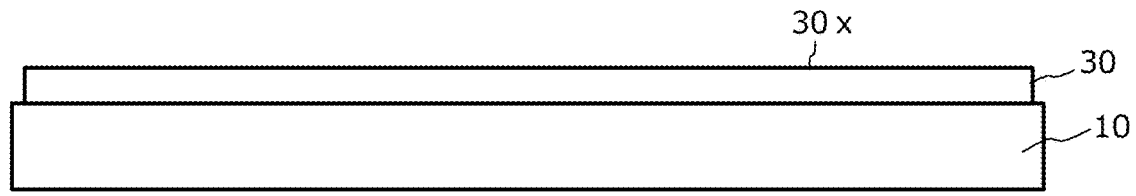
FIG. 19A is a cross-sectional view illustrating a step of the flexible OLED device production method in an embodiment of the present disclosure.

First, see FIG. 19A. FIG. 19A is a cross-sectional view showing the glass base 10 with the plastic film 30 provided on the surface of the glass base 10. The glass base 10 is a supporting substrate for processes. The thickness of the glass base 10 can be, for example, about 0.3-0.7 mm.

In the present embodiment, the plastic film 30 is a polyimide film having a thickness of, for example, not less than 5 µm and not more than 100 µm. The polyimide film can be formed from a polyamide acid, which is a precursor of polyimide, or a polyimide solution. The polyimide film may be formed by forming a polyamide acid film on the surface of the glass base 10 and then thermally imidizing the polyamide acid film. Alternatively, the polyimide film may be formed by forming, on the surface of the glass base 10, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface 30s of the glass base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin layers. In one form of the present embodiment, in delaminating a flexible display structure from the glass base 10, laser lift-off is carried out such that the plastic film 30 is irradiated with ultraviolet laser light transmitted through the glass base 10. A part of the plastic film 30 at the interface with the glass base 10 needs to absorb the ultraviolet laser light and decompose (disappear). Alternatively, for example, a sacrificial layer which is to absorb laser light of a certain wavelength band and produce a gas may be provided between the glass base 10 and the plastic film 30. In this case, the plastic film 30 can be easily delaminated from the glass base 10 by irradiating the sacrificial layer with the laser light. Providing the sacrificial layer also achieves the effect of suppressing generation of ashes.

<Polishing>

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

<Lower Gas Barrier Film>

Then, a gas barrier film may be formed on the plastic film 30. The gas barrier film can have various structures. Examples of the gas barrier film include a silicon oxide film and a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

<Functional Layer Region>

Hereinafter, the process of forming the functional layer regions 20, including the TFT layer 20A and the OLED layer 20B, and the upper gas barrier film 40 is described.

Figure 19B:
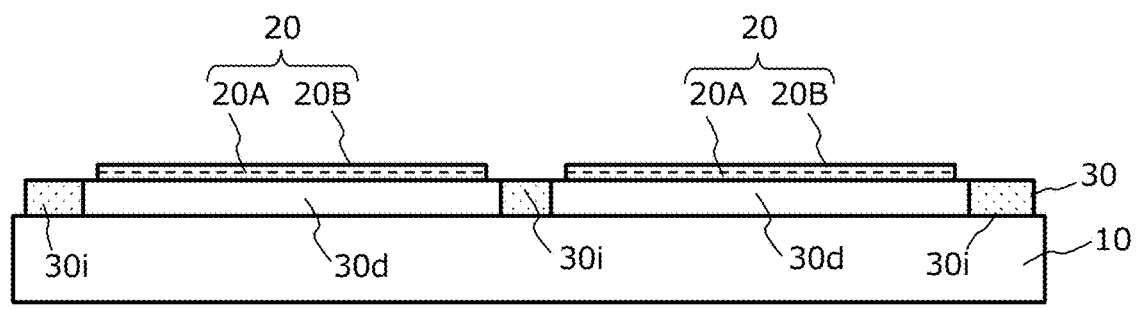
FIG. 19B is a cross-sectional view illustrating a step of the flexible OLED device production method in an embodiment of the present disclosure.

First, as shown in FIG. 19B, a plurality of functional layer regions 20 are formed on a glass base 10. There is a plastic film 30 between the glass base 10 and the functional layer regions 20. The plastic film 30 is bound to the glass base 10.

More specifically, the functional layer regions 20 include a TFT layer 20A (lower layer) and an OLED layer 20B (upper layer). The TFT layer 20A and the OLED layer 20B are sequentially formed by a known method. The TFT layer 20A includes a circuit of a TFT array which realizes an active matrix. The OLED layer 20B includes an array of OLED elements, each of which can be driven independently. The thickness of the TFT layer 20A is, for example, 4 µm. The thickness of the OLED layer 20B is, for example, 1 µm.

Figure 20:
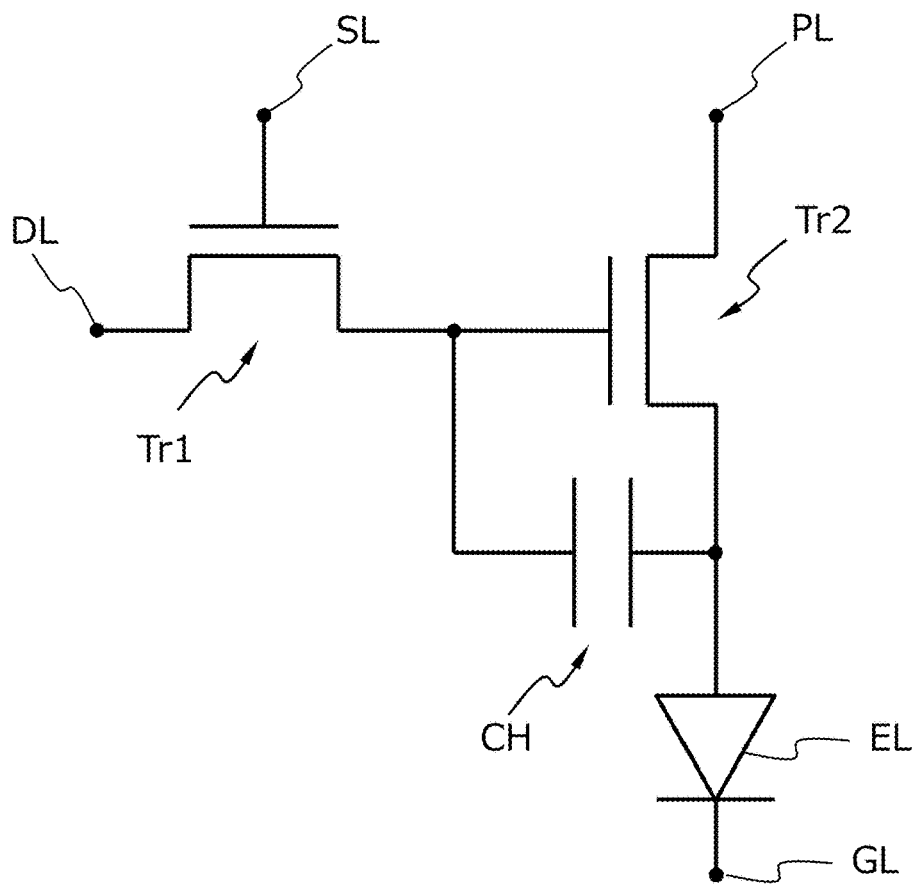
FIG. 20 is an equivalent circuit diagram of a single sub-pixel in a flexible OLED device.

FIG. 20 is a basic equivalent circuit diagram of a sub-pixel in an organic EL (Electro Luminescence) display. A single pixel of the display can consist of sub-pixels of different colors such as, for example, R (red), G (green), and B (blue). The example illustrated in FIG. 20 includes a selection TFT element Tr1, a driving TFT element Tr2, a storage capacitor CH, and an OLED element EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the OLED element EL. When the driving TFT element Tr2 is ON, an electric current flows from the power line PL to a ground line GL via the OLED element EL. This electric current allows the OLED element EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The OLED layer 20B includes an OLED element EL. Before formation of the OLED layer 20B, the upper surface of the TFT layer 20A is planarized by an interlayer insulating film that covers the TFT array and various wires. A structure which supports the OLED layer 20B and which realizes active matrix driving of the OLED layer 20B is referred to as "backplane".

The circuit elements and part of the lines shown in FIG. 20 can be included in any of the TFT layer 20A and the OLED layer 20B. The lines shown in FIG. 20 are connected with an unshown driver circuit.

In the embodiment of the present disclosure, the TFT layer 20A and the OLED layer 20B can have various specific configurations. These configurations do not limit the present disclosure. The TFT element included in the TFT layer 20A may have a bottom gate type configuration or may have a top gate type configuration. Emission by the OLED element included in the OLED layer 20B may be of a bottom emission type or may be of a top emission type. The specific configuration of the OLED element is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

<Upper Gas Barrier Film>

Figure 19C:
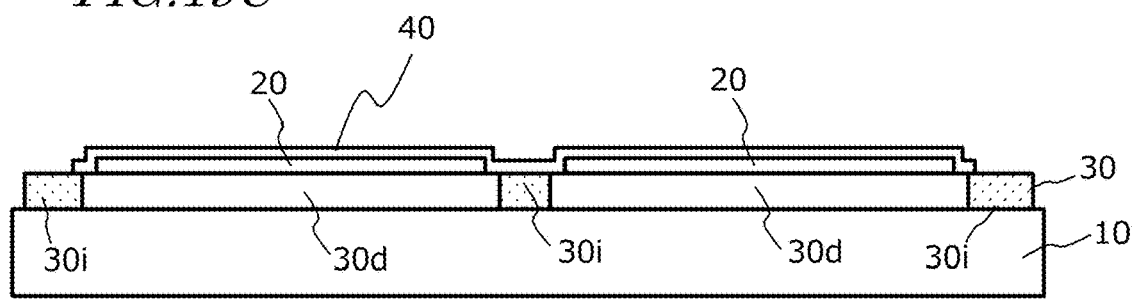
FIG. 19C is a cross-sectional view illustrating a step of the flexible OLED device production method in an embodiment of the present disclosure.

After formation of the above-described functional layer, the entirety of the functional layer regions 20 is covered with a gas barrier film (upper gas barrier film) 40 as shown in FIG. 19C. A typical example of the upper gas barrier film 40 is a multilayer film including an inorganic material layer and an organic material layer. Elements such as an adhesive film, another functional layer which is a constituent of a touch-screen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. From the viewpoint of encapsulation reliability, the WVTR (Water Vapor Transmission Rate) of a thin film encapsulation structure is typically required to be not more than $1 \times 10^{-4}$ g/m$^2$/day. According to the embodiment of the present disclosure, this criterion is met. The thickness of the upper gas barrier film 40 is, for example, not more than 2.0 μm.

Figure 21:
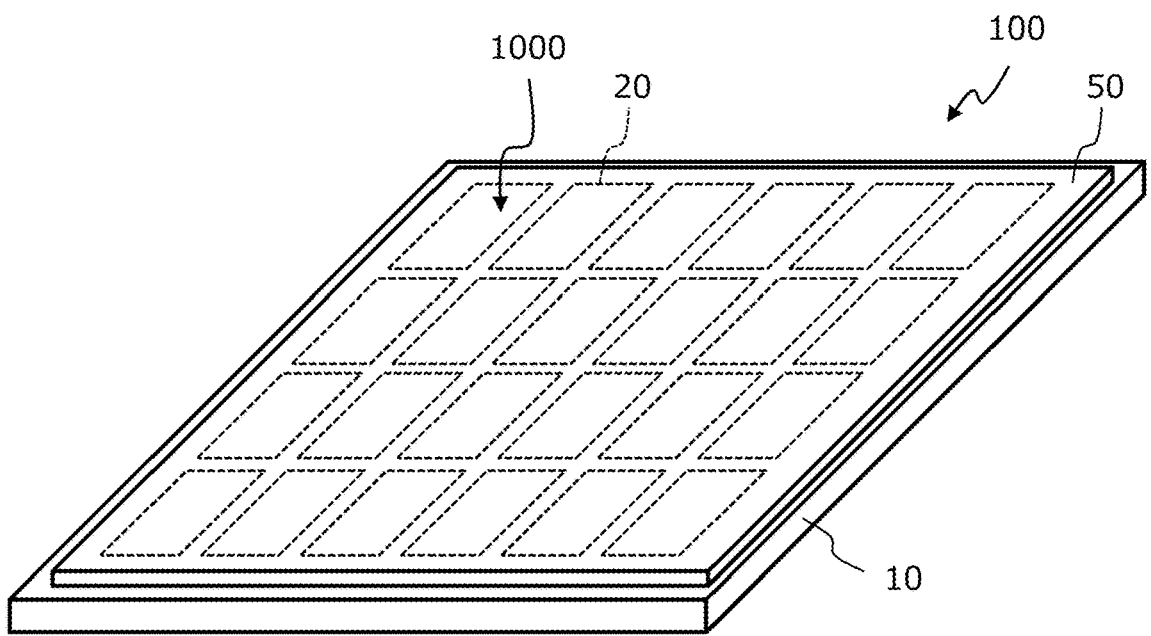
FIG. 21 is a perspective view of the multilayer stack in the middle of the production process.

FIG. 21 is a perspective view schematically showing the upper surface side of the multilayer stack 100 at a point in time when the upper gas barrier film 40 is formed. A single multilayer stack 100 includes a plurality of OLED devices 1000 supported by the glass base 10. In the example illustrated in FIG. 21, a single multilayer stack 100 includes a larger number of functional layer regions 20 than in the example illustrated in FIG. 1A. As previously described, the number of functional layer regions 20 supported by a single glass base 10 is arbitrary.

<Protection Sheet>

Figure 19D:
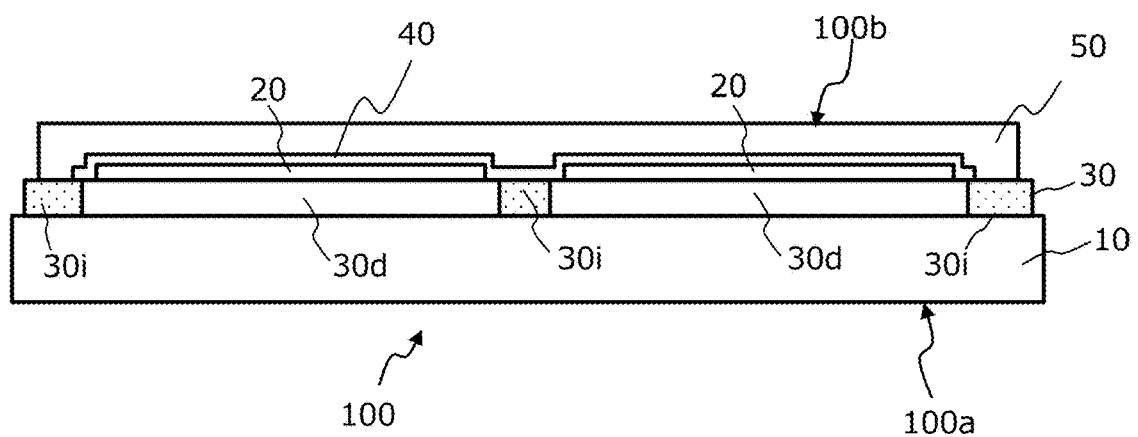
FIG. 19D is a cross-sectional view illustrating a step of the flexible OLED device production method in an embodiment of the present disclosure.

Next, refer to FIG. 19D. As shown in FIG. 19D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 μm and not more than 200 μm.

After the thus-formed multilayer stack 100 is provided, the production method of the present disclosure can be carried out using the above-described production apparatus (delaminating apparatus 220).

INDUSTRIAL APPLICABILITY

An embodiment of the present invention provides a novel flexible OLED device production method. A flexible OLED device is broadly applicable to smartphones, tablet computers, on-board displays, and small-, medium- and large-sized television sets.

REFERENCE SIGNS LIST

10 . . . glass base, 20 . . . functional layer region, 20A . . . TFT layer, 20B . . . OLED layer, 30 . . . plastic film, 40 . . . gas barrier film, 50 . . . protection sheet, 100 . . . multilayer stack, 212 . . . stage, 220 . . . delaminating apparatus, 1000 . . . OLED device

The invention claimed is:

1. A method for producing a flexible OLED device, comprising:
   providing a multilayer stack which has a first surface and a second surface, the multilayer stack including
      a glass base which defines the first surface,
      a plurality of functional layer regions each including a TFT layer and an OLED layer,
      a synthetic resin film provided between the glass base and the plurality of functional layer regions and bound to the glass base, the synthetic resin film including a plurality of flexible substrate regions respectively supporting the plurality of functional layer regions and an intermediate region surrounding the plurality of flexible substrate regions, and
      a protection sheet which covers the plurality of functional layer regions and which defines the second surface;
   dividing the intermediate region and respective ones of the plurality of flexible substrate regions of the synthetic resin film from one another;
   irradiating an interface between the plurality of flexible substrate regions of the synthetic resin film and the glass base with laser light; and
   separating the multilayer stack into a first portion and a second portion by increasing a distance from a stage to the glass base while the second surface of the multilayer stack is kept in contact with the stage, wherein the first portion of the multilayer stack includes a plurality of OLED devices which are in contact with the stage, and the plurality of OLED devices respectively include the plurality of functional layer regions and include the plurality of flexible substrate regions of the synthetic resin film, the second portion of the multilayer stack includes the glass base and the intermediate region of the synthetic resin film, a surface of the stage includes a first region which is to face the plurality of OLED devices and a second region which is to face the intermediate region of the synthetic resin film, and suction in the first region is greater than suction in the second region.

2. The method of claim 1, wherein separating the multilayer stack into the first portion and the second portion is carried out while the stage holds the second surface of the multilayer stack.

3. The method of claim 2, wherein irradiating the interface between the plurality of flexible substrate regions of the synthetic resin film and the glass base with the laser light is carried out while the stage holds the second surface of the multilayer stack.

4. The method of claim 1 further comprising, after separating the multilayer stack into the first portion and the second portion, sequentially or concurrently performing a process on the plurality of OLED devices which are in contact with the stage, wherein the process includes at least one of the steps of attaching a dielectric and/or electrically-conductive film to each of the plurality of OLED devices, cleaning or etching each of the plurality of OLED devices, and mounting an optical part and/or an electronic part to each of the plurality of OLED devices.

5. The method of claim 1 further comprising, after separating the multilayer stack into the first portion and the second portion, adhering another protection sheet to the plurality of OLED devices which are in contact with the stage.

6. The method of claim 5 further comprising detaching from the stage the plurality of OLED devices which are bound to the another protection sheet.

7. The method of claim 6 further comprising sequentially or concurrently performing a process on the plurality of OLED devices which are bound to the another protection sheet, wherein the process includes at least one of the steps of attaching a dielectric and/or electrically-conductive film to each of the plurality of OLED devices, cleaning or etching each of the plurality of OLED devices, and mounting an optical part and/or an electronic part to each of the plurality of OLED devices.

8. A method for producing a flexible OLED device, comprising:

providing a multilayer stack which has a first surface and a second surface, the multilayer stack including
a glass base which defines the first surface,
a plurality of functional layer regions each including a TFT layer and an OLED layer,
a synthetic resin film provided between the glass base and the plurality of functional layer regions and bound to the glass base, the synthetic resin film including a plurality of flexible substrate regions respectively supporting the plurality of functional layer regions and an intermediate region surrounding the plurality of flexible substrate regions, and
a protection sheet which covers the plurality of functional layer regions and which defines the second surface;

dividing the intermediate region and respective ones of the plurality of flexible substrate regions of the synthetic resin film from one another;

irradiating an interface between the plurality of flexible substrate regions of the synthetic resin film and the glass base with laser light; and separating the multilayer stack into a first portion and a second portion by increasing a distance from a stage to the glass base while the second surface of the multilayer stack is kept in contact with the stage, wherein the first portion of the multilayer stack includes a plurality of OLED devices which are in contact with the stage, and the plurality of OLED devices respectively include the plurality of functional layer regions and include the plurality of flexible substrate regions of the synthetic resin film, and the second portion of the multilayer stack includes the glass base and the intermediate region of the synthetic resin film, wherein the method further comprises, before bringing the second surface of the multilayer stack into contact with the stage, placing a suction sheet on the stage, the suction sheet having a plurality of openings, wherein the stage includes a porous plate on which the suction sheet is to be placed, and the suction sheet includes a first region which is to be in contact with the plurality of OLED devices and a second region which is to face the intermediate region of the synthetic resin film, an aperture ratio of the first region being higher than an aperture ratio of the second region.

9. The method of claim 8 further comprising, after separating the multilayer stack into the first portion and the second portion, sequentially or concurrently performing a process on the plurality of OLED devices which are in contact with the stage, wherein the process includes at least one of the steps of attaching a dielectric and/or electrically-conductive film to each of the plurality of OLED devices, cleaning or etching each of the plurality of OLED devices, and mounting an optical part and/or an electronic part to each of the plurality of OLED devices.

* * * * *